(12) United States Patent
Ju et al.

(10) Patent No.: US 11,901,456 B2
(45) Date of Patent: Feb. 13, 2024

(54) FINFET DEVICES WITH A BACKSIDE POWER RAIL AND A BACKSIDE SELF-ALIGNED VIA DISPOSED BETWEEN DIELECTRIC FINS

(71) Applicant: Taiwan Semiconductor Manufacturing Co., Ltd., Hsinchu (TW)

(72) Inventors: Shi Ning Ju, Hsinchu (TW); Kuo-Cheng Chiang, Hsinchu County (TW); Chih-Hao Wang, Hsinchu County (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/838,941

(22) Filed: Jun. 13, 2022

(65) Prior Publication Data
US 2022/0310841 A1    Sep. 29, 2022

Related U.S. Application Data

(62) Division of application No. 17/081,894, filed on Oct. 27, 2020, now Pat. No. 11,362,213.
(Continued)

(51) Int. Cl.
*H01L 29/78* (2006.01)
*H01L 23/522* (2006.01)
(Continued)

(52) U.S. Cl.
CPC .... *H01L 29/7851* (2013.01); *H01L 21/76897* (2013.01); *H01L 21/823431* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS

| 9,608,069 B1 | 3/2017 | Basker et al. |
| 10,115,825 B1 | 10/2018 | Liaw |

(Continued)

FOREIGN PATENT DOCUMENTS

| CN | 110556374 A | 12/2019 |
| KR | 20190015269 A | 2/2019 |

(Continued)

OTHER PUBLICATIONS

Chen, Chun-Yuan et al., "Semiconductor Devices with Backside Air Gap Dielectric", U.S. Appl. No. 16/888,217, filed May 29, 2020, Assignee Taiwan Semiconductor Manufacturing Co., Ltd., 26 pages specification, 16 pages drawings.

(Continued)

*Primary Examiner* — Younes Boulghassoul
(74) *Attorney, Agent, or Firm* — HAYNES AND BOONE, LLP

(57) ABSTRACT

A semiconductor structure includes a power rail on a back side of the semiconductor structure, a first interconnect structure on a front side of the semiconductor structure, and a source feature, a drain feature, a first semiconductor fin, and a gate structure that are between the power rail and the first interconnect structure. The first semiconductor fin connects the source feature and the drain feature. The gate structure is disposed on a front surface and two side surfaces of the first semiconductor fin. The semiconductor structure further includes an isolation structure disposed between the power rail and the drain feature and between the power rail and the first semiconductor fin and a via penetrating through (Continued)

the isolation structure and connecting the source feature to the power rail.

20 Claims, 22 Drawing Sheets

Related U.S. Application Data

(60) Provisional application No. 63/002,792, filed on Mar. 31, 2020.

(51) Int. Cl.
  *H01L 23/528* (2006.01)
  *H01L 27/088* (2006.01)
  *H01L 27/092* (2006.01)
  *H01L 29/417* (2006.01)
  *H01L 21/768* (2006.01)
  *H01L 21/8234* (2006.01)
  *H01L 29/66* (2006.01)
  *H01L 21/8238* (2006.01)
  *H01L 21/762* (2006.01)

(52) U.S. Cl.
  CPC ........... *H01L 21/823468* (2013.01); *H01L 21/823475* (2013.01); *H01L 21/823871* (2013.01); *H01L 21/823878* (2013.01); *H01L 23/5226* (2013.01); *H01L 23/5283* (2013.01); *H01L 23/5286* (2013.01); *H01L 27/0886* (2013.01); *H01L 27/0924* (2013.01); *H01L 29/4175* (2013.01); *H01L 29/41791* (2013.01); *H01L 29/6681* (2013.01); *H01L 29/66545* (2013.01); *H01L 29/66636* (2013.01); *H01L 29/66795* (2013.01); *H01L 21/76224* (2013.01); *H01L 21/823418* (2013.01)

(58) Field of Classification Search
  CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 29/4175; H01L 29/41766; H01L 29/41775; H01L 29/41783; H01L 29/41725; H01L 29/41733; H01L 21/823475; H01L 21/823871; H01L 21/76895; H01L 21/76897; H01L 21/76898; H01L 21/743; H01L 21/76804; H01L 21/76805; H01L 23/5226; H01L 23/5283; H01L 23/5286; H01L 23/528; H01L 23/481; H01L 23/5384; H01L 23/49827; H01L 21/823418; H01L 21/823814; H01L 29/0847; H01L 29/7848; H01L 29/66636; H01L 29/66575; H01L 29/0649; H01L 29/0653; H01L 29/6681; H01L 21/823481; H01L 21/823878; H01L 21/76224; H01L 21/76229; H01L 21/76232

See application file for complete search history.

(56) References Cited

U.S. PATENT DOCUMENTS

| | | | |
|---|---|---|---|
| 2017/0005195 | A1 | 1/2017 | Ching et al. |
| 2017/0243868 | A1 | 8/2017 | Lee et al. |
| 2018/0248012 | A1* | 8/2018 | Morrow ............ H01L 29/66636 |
| 2019/0035908 | A1 | 1/2019 | Liao et al. |
| 2019/0139836 | A1 | 5/2019 | Chu et al. |
| 2019/0164882 | A1 | 5/2019 | Chen et al. |
| 2019/0221649 | A1* | 7/2019 | Glass ................. H01L 27/0924 |
| 2019/0259699 | A1* | 8/2019 | Morrow ................ G06F 30/394 |
| 2019/0371933 | A1 | 12/2019 | Chen et al. |
| 2019/0378790 | A1* | 12/2019 | Bohr ................ H01L 21/823481 |
| 2020/0035560 | A1* | 1/2020 | Block ................. H01L 27/1207 |
| 2020/0105759 | A1* | 4/2020 | Bowonder ...... H01L 21/823871 |
| 2020/0303509 | A1* | 9/2020 | Mehandru ......... H01L 29/66795 |
| 2020/0365509 | A1* | 11/2020 | Sasaki ............... H01L 21/76898 |
| 2021/0028112 | A1* | 1/2021 | Kim .................. H01L 21/76843 |
| 2021/0134721 | A1* | 5/2021 | Chiang ............. H01L 29/42392 |
| 2021/0202385 | A1 | 7/2021 | Huang |
| 2021/0305252 | A1* | 9/2021 | Chiang ............. H01L 29/78696 |
| 2021/0305262 | A1 | 9/2021 | Wang |
| 2021/0305381 | A1 | 9/2021 | Chiang |
| 2021/0376071 | A1 | 12/2021 | Liu |
| 2021/0391421 | A1 | 12/2021 | Chu |

FOREIGN PATENT DOCUMENTS

| | | |
|---|---|---|
| KR | 20190024580 A | 3/2019 |
| KR | 20190064523 A | 6/2019 |
| KR | 20200026732 A | 3/2020 |
| TW | 201725727 A | 7/2017 |
| TW | 202005031 A | 1/2020 |
| WO | 2018004653 A1 | 1/2018 |

OTHER PUBLICATIONS

Su, Huan-Chieh et al., "Backside Power Rail and Methods of Forming the Same", U.S. Appl. No. 16/901,963, filed Jun. 15, 2020, Assignee Taiwan Semiconductor Manufacturing Co., Ltd., 28 pages specification, 22 pages drawings.

Chen, Chun-Yuan et al., "Anchor-Shaped Backside Via and Method Thereof", U.S. Appl. No. 16/926,447, filed Jul. 10, 2020, Assignee Taiwan Semiconductor Manufacturing Co., Ltd., 32 pages specification, 16 pages drawings.

* cited by examiner

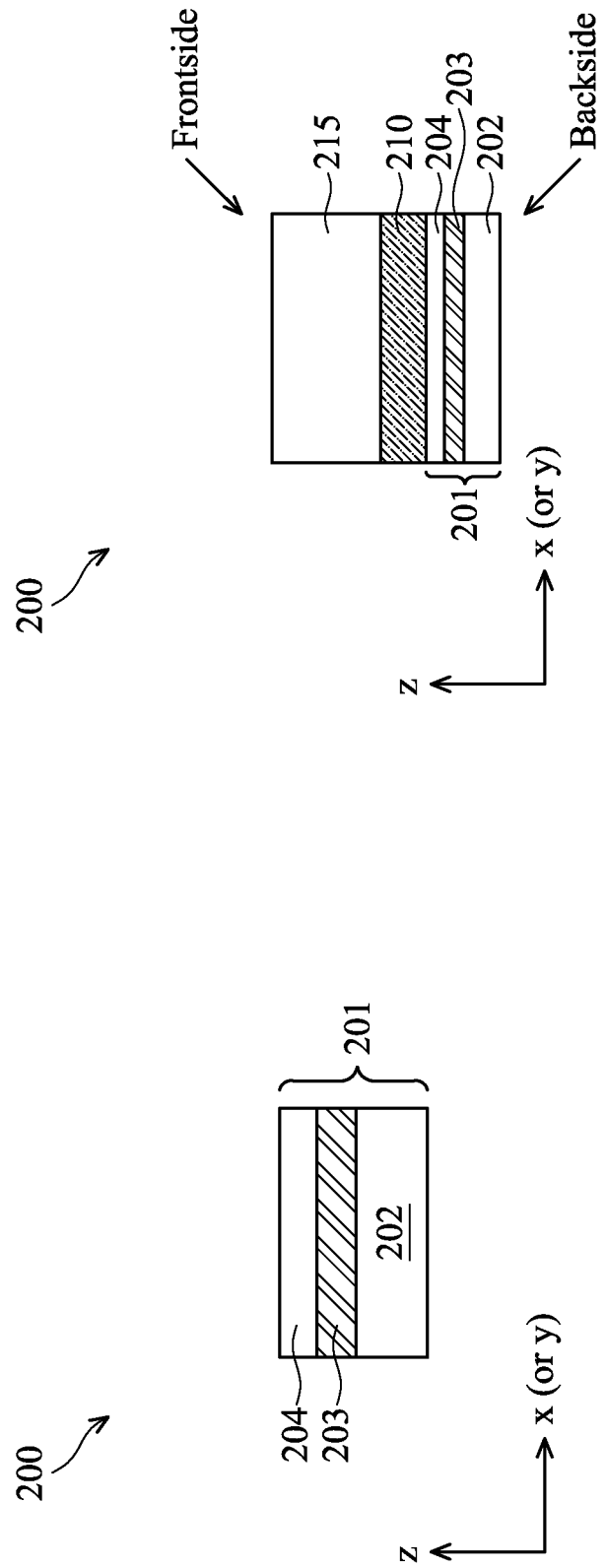

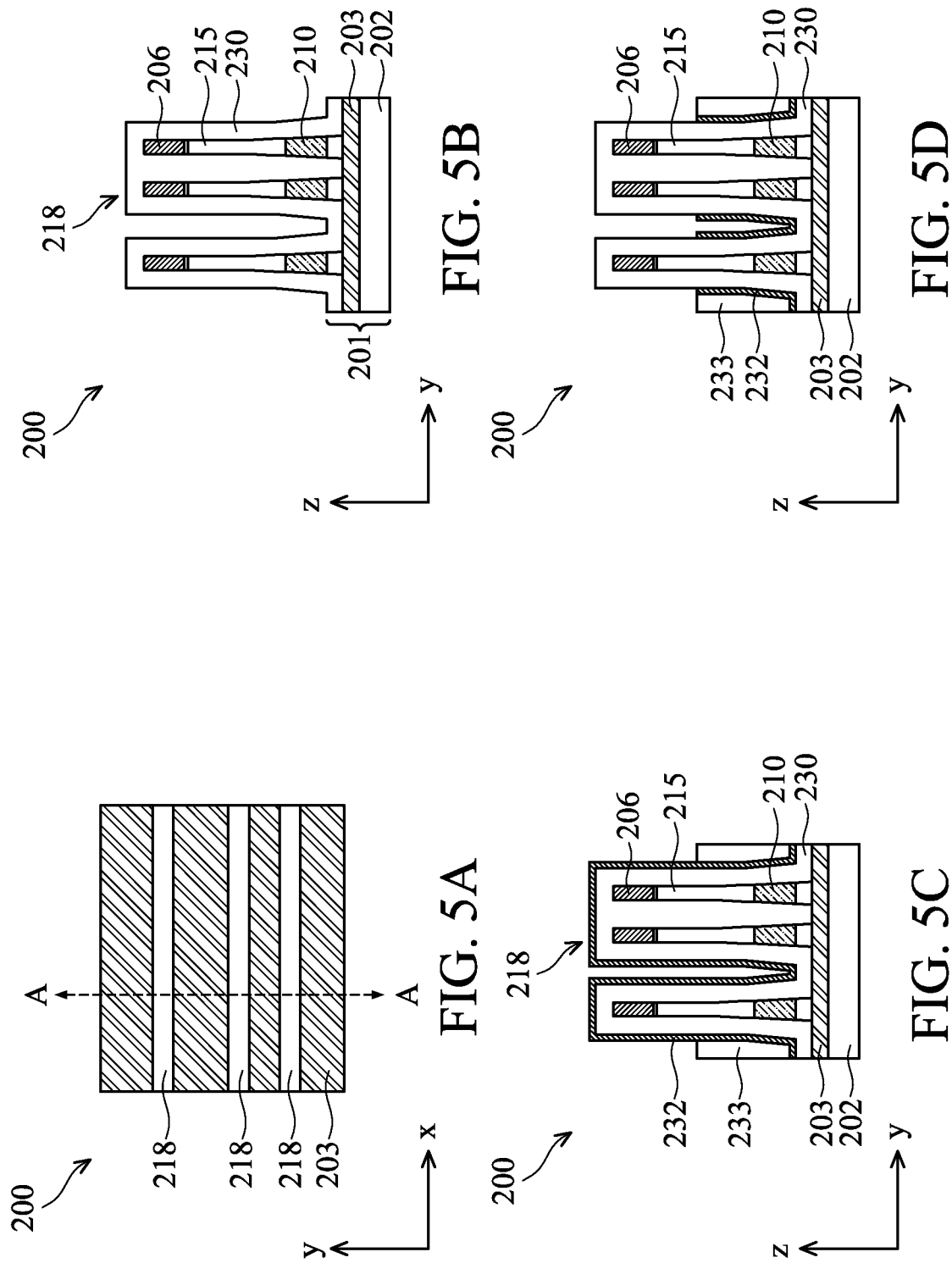

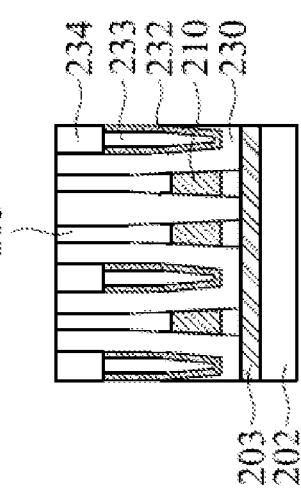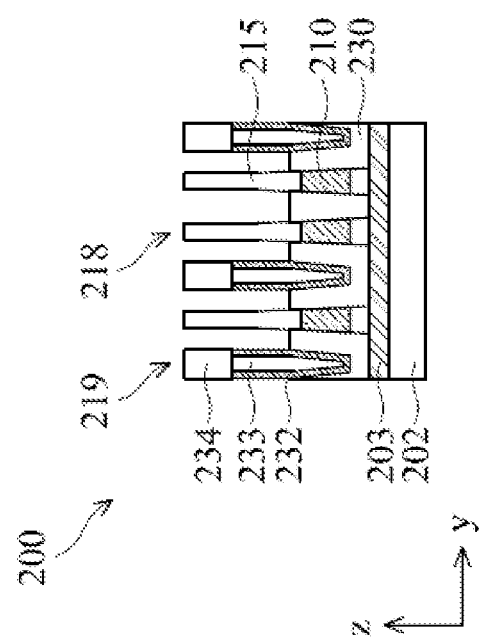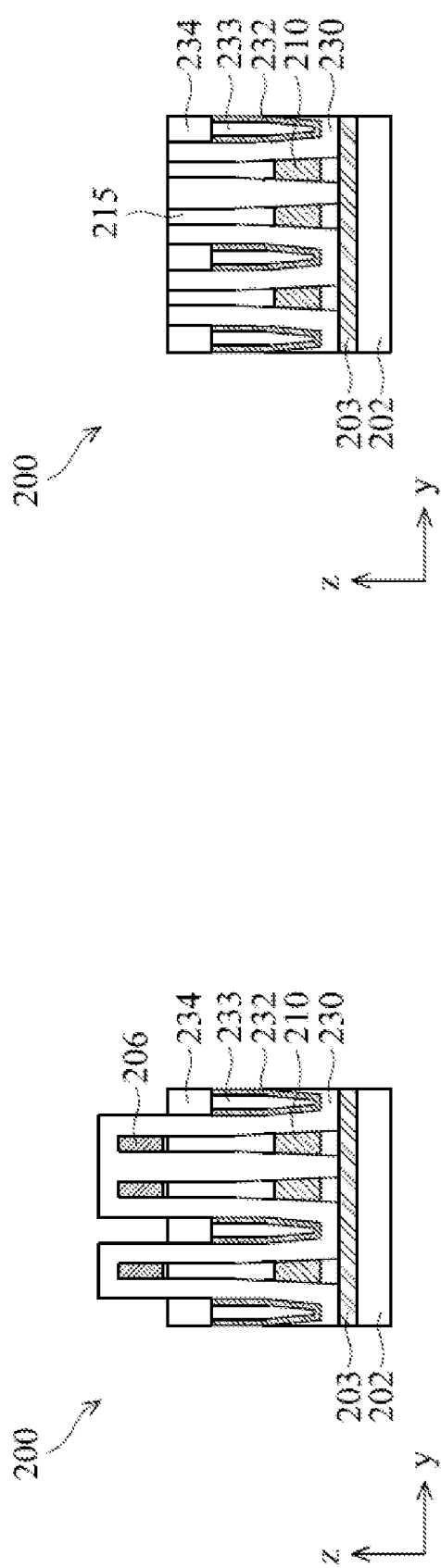

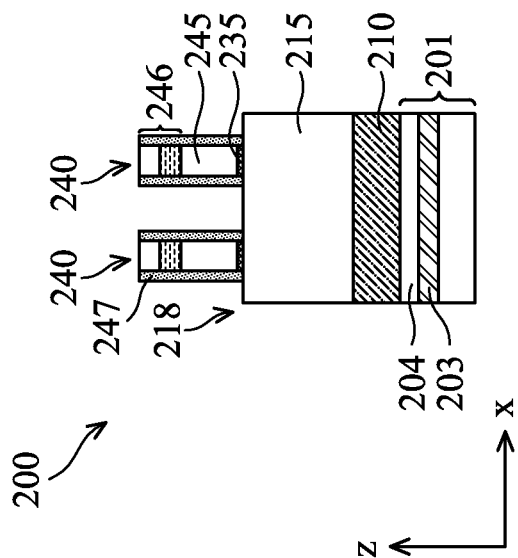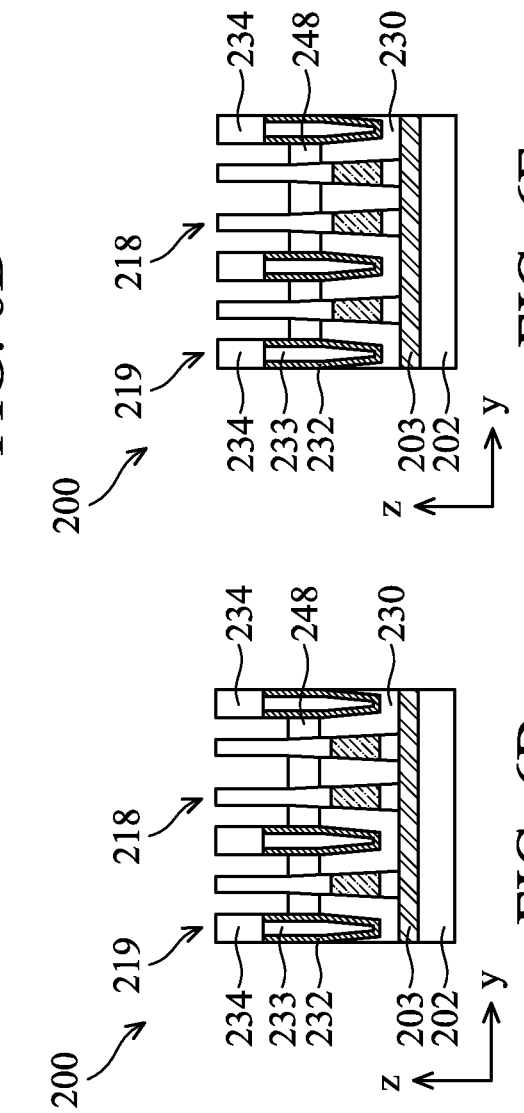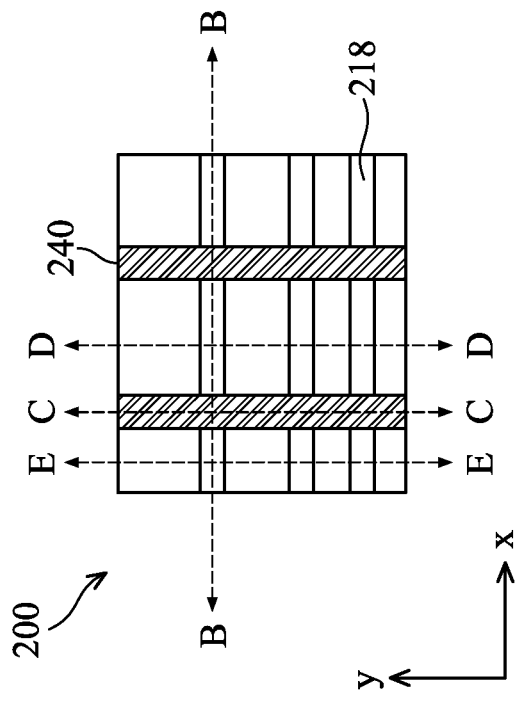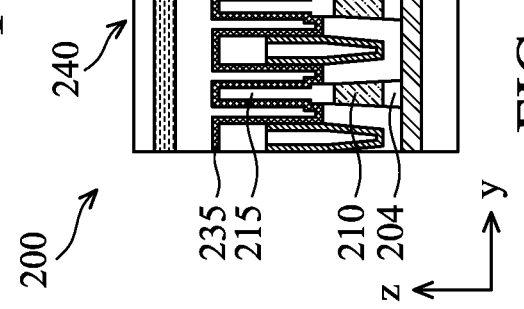

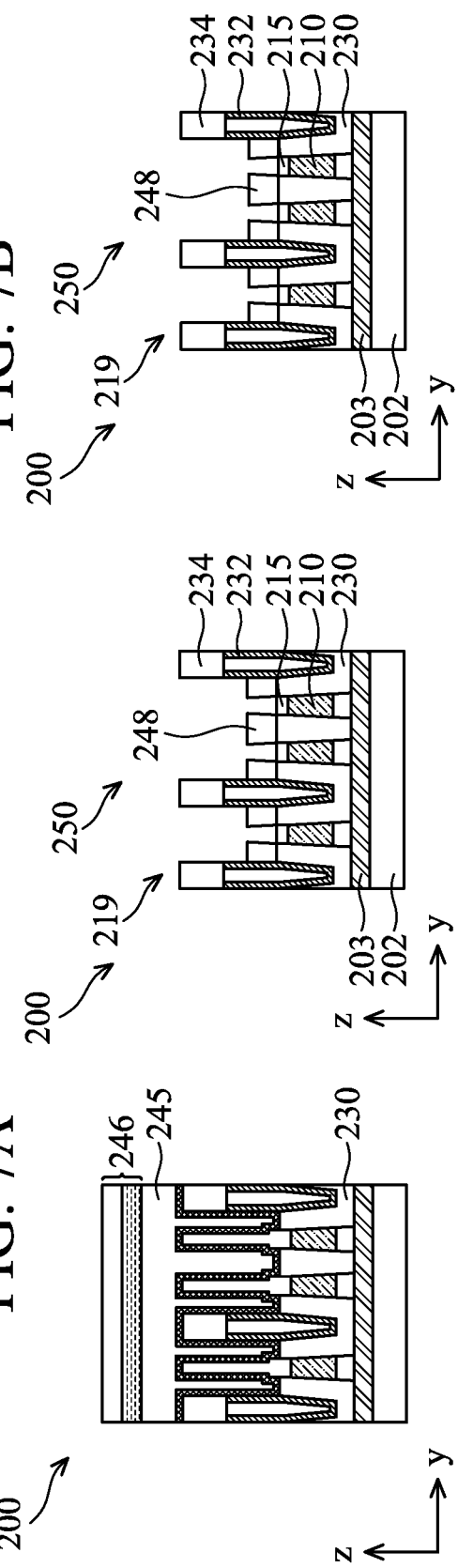
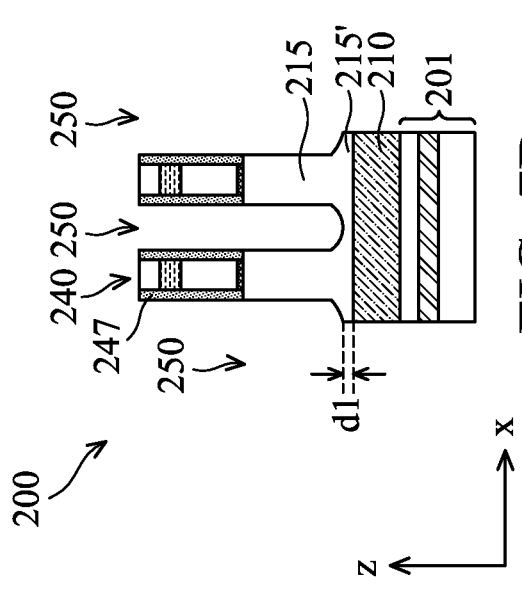
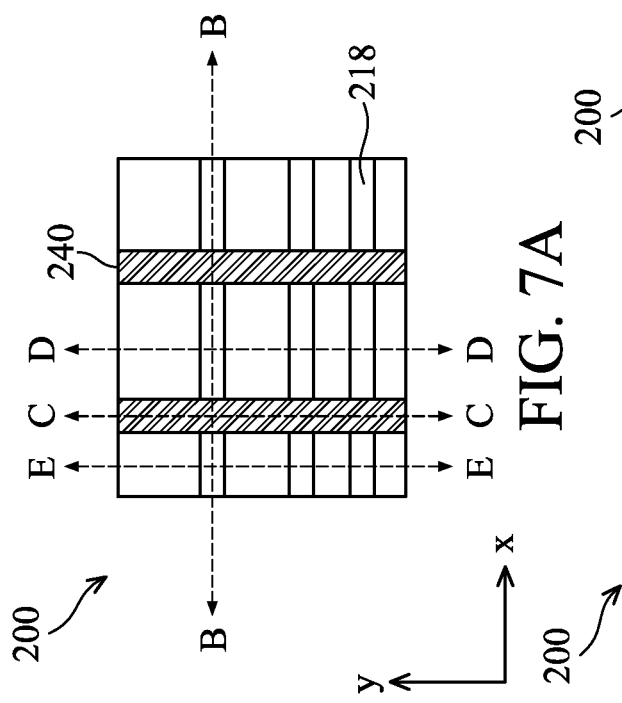
FIG. 7A  FIG. 7B  FIG. 7C  FIG. 7D  FIG. 7E

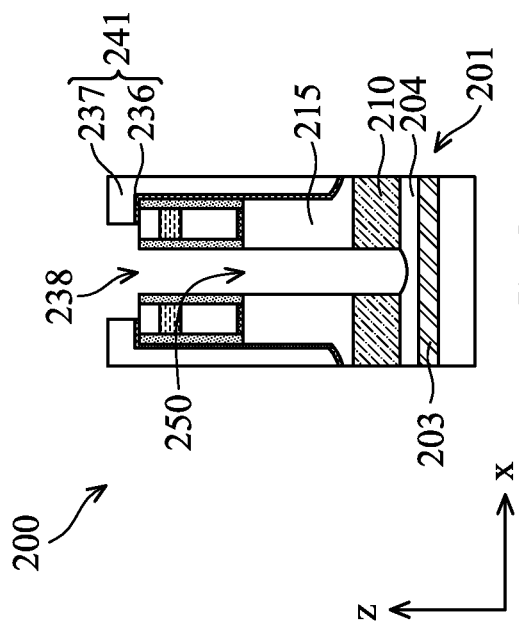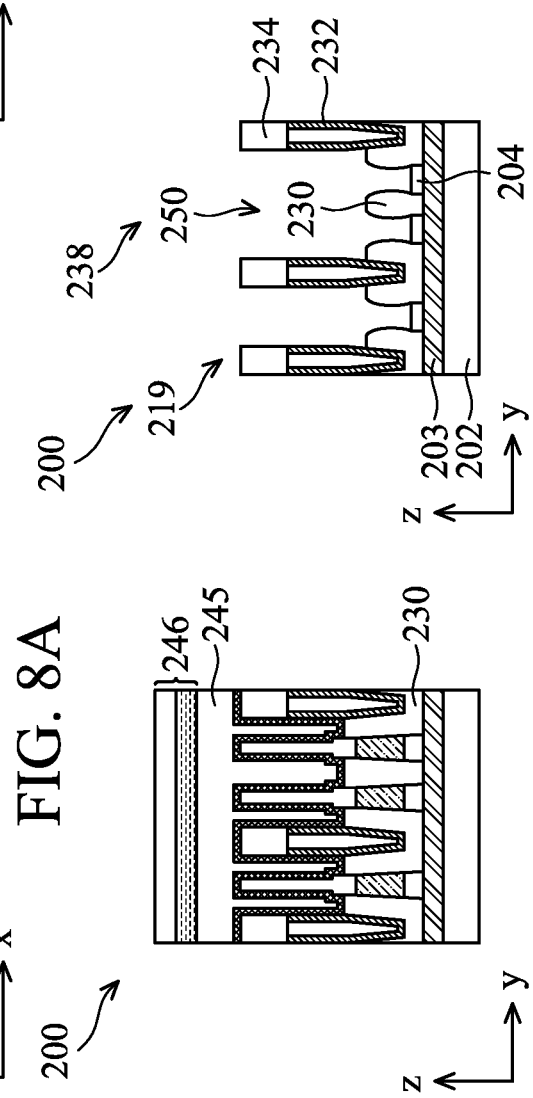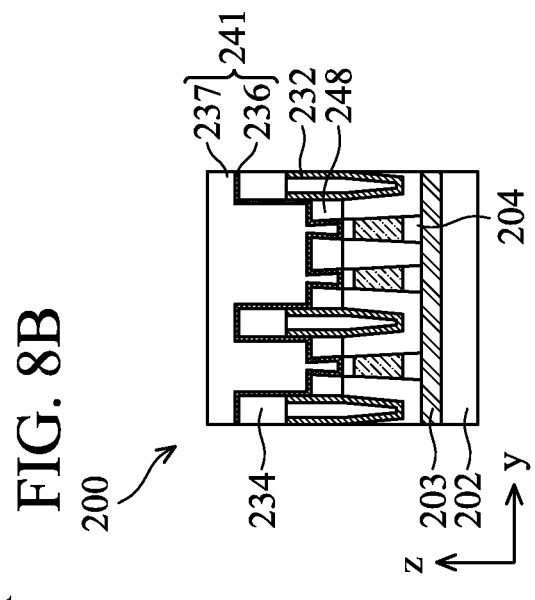
FIG. 8A
FIG. 8B
FIG. 8C
FIG. 8D
FIG. 8E

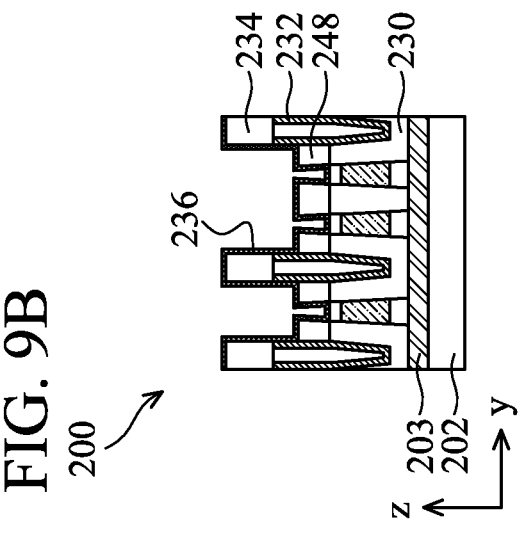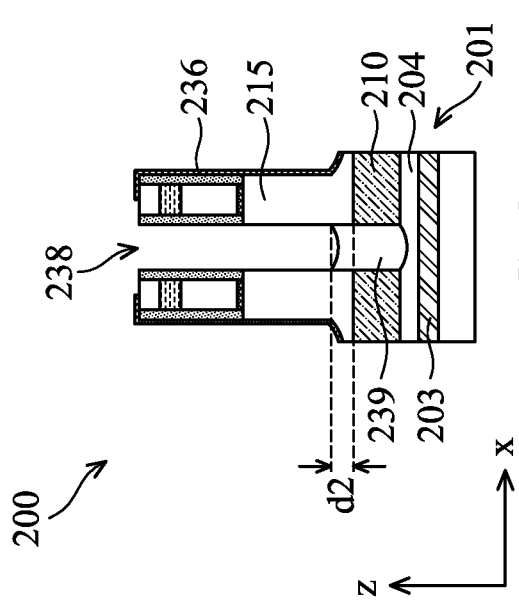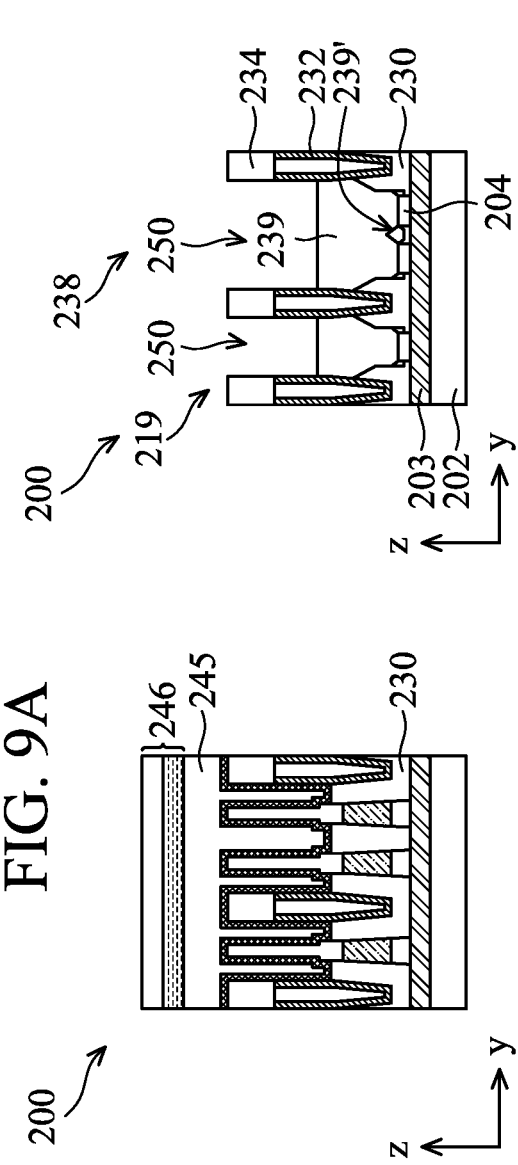

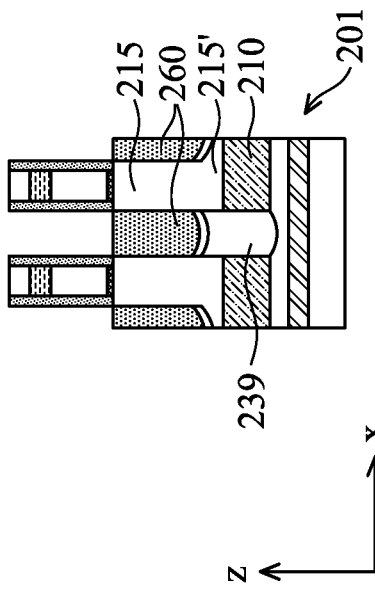
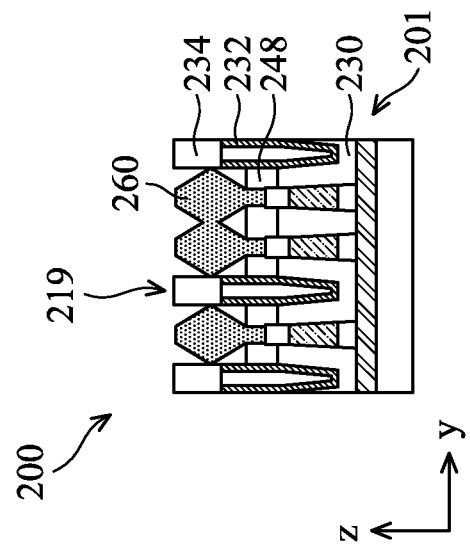
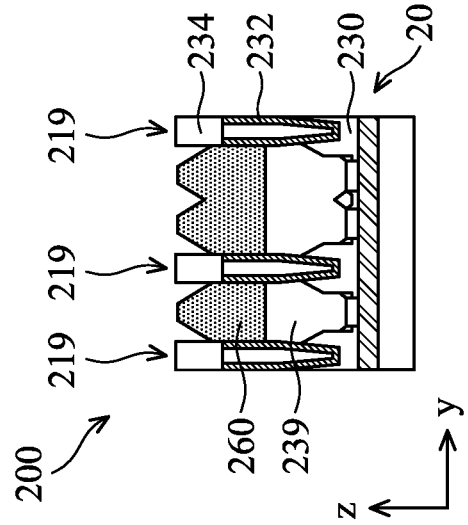
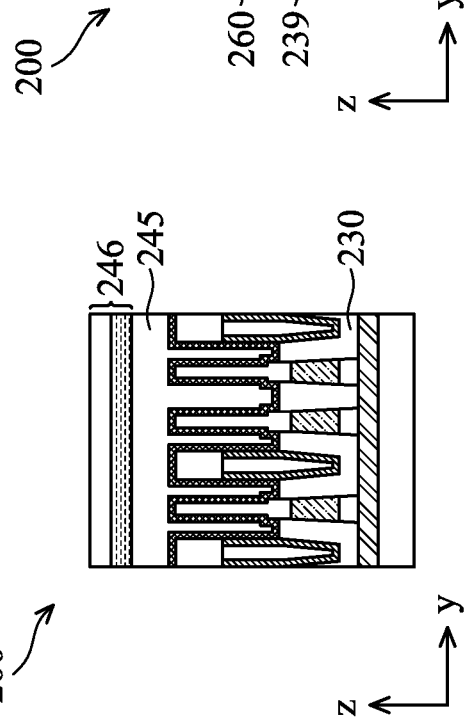
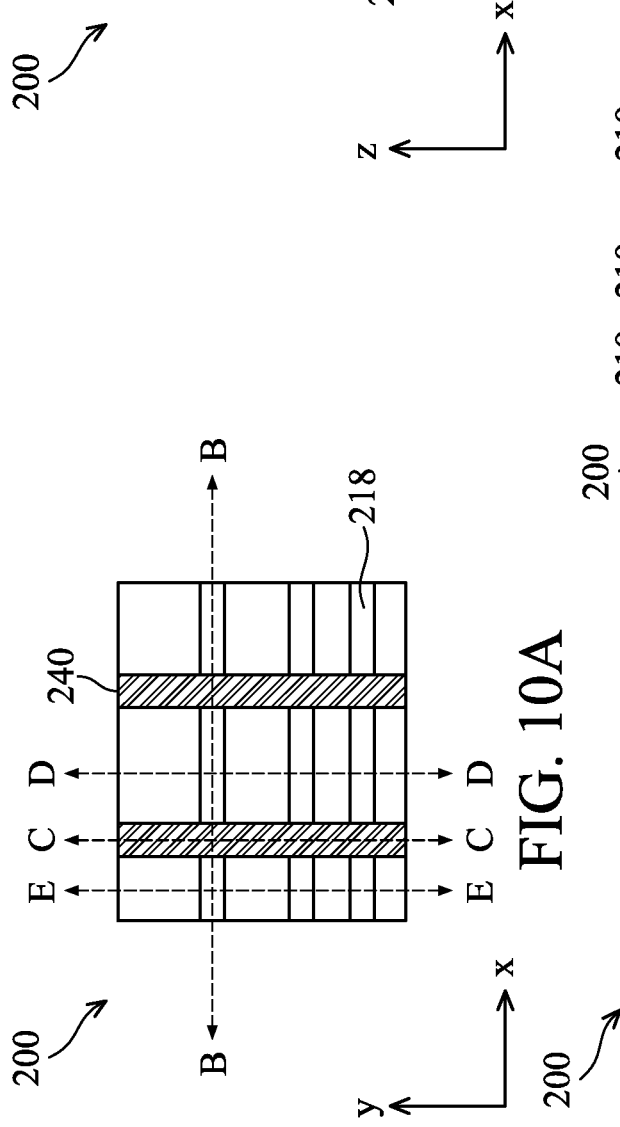

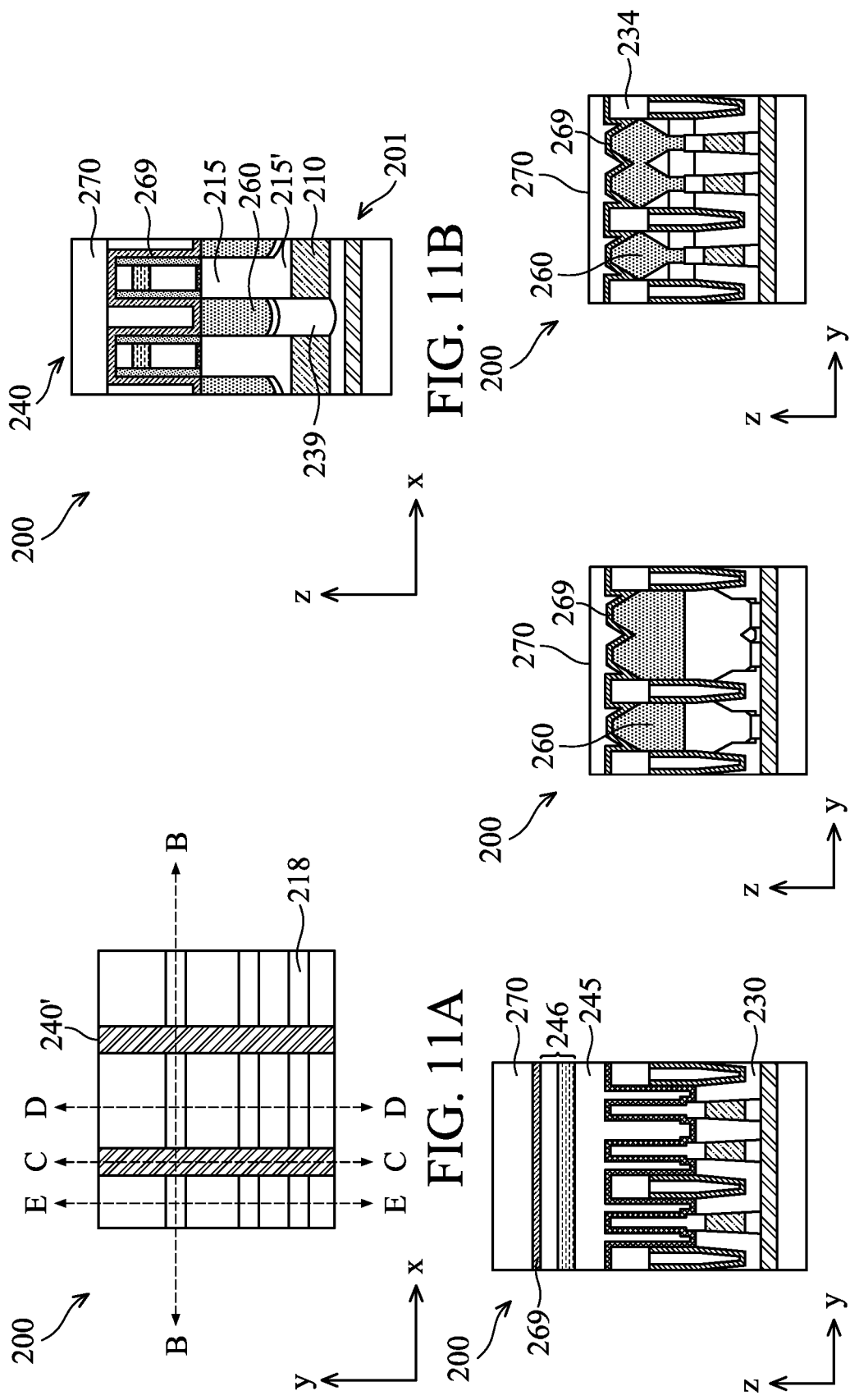

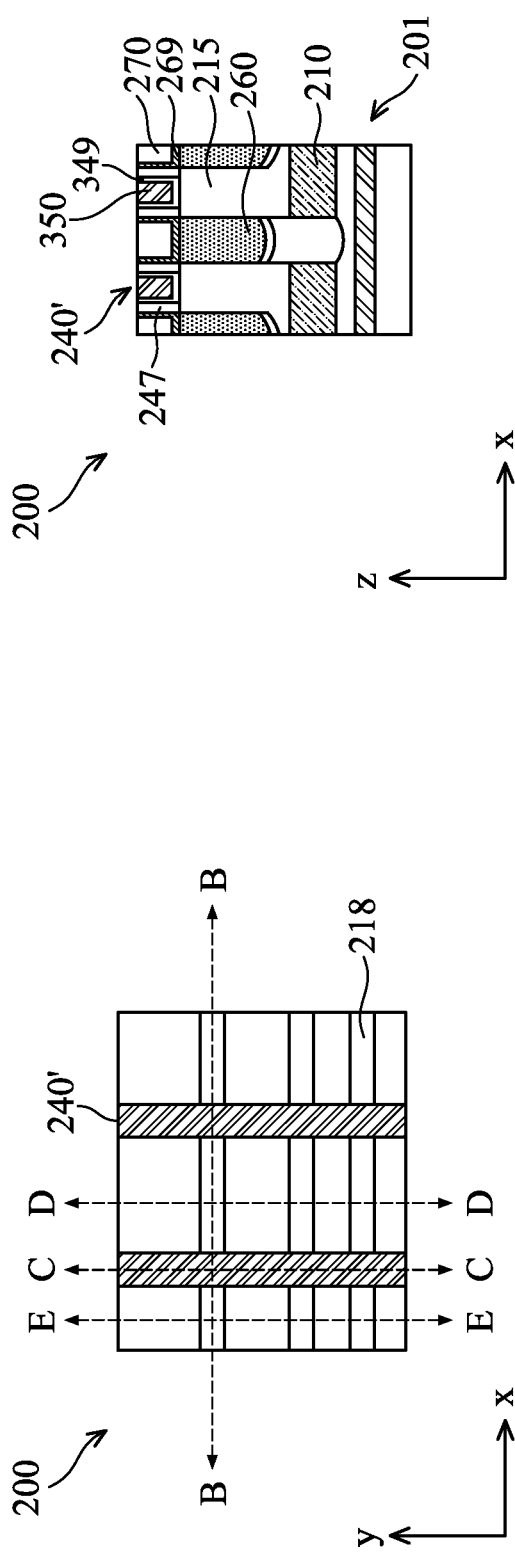
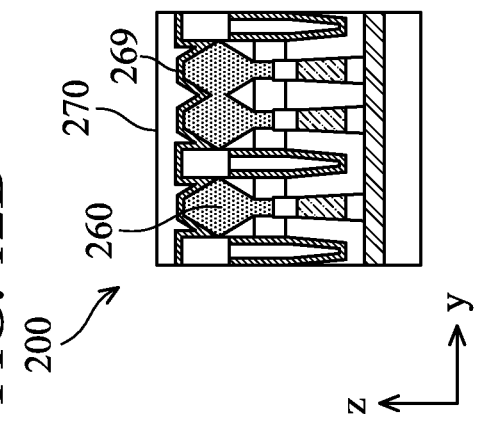
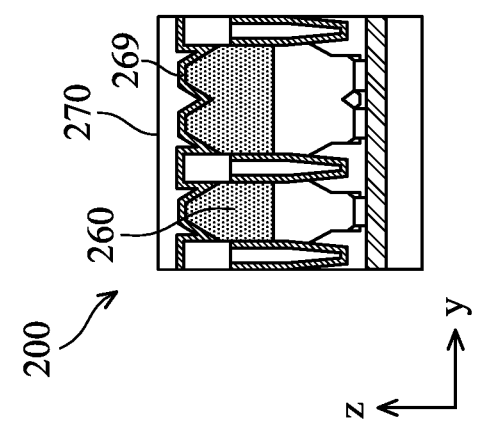
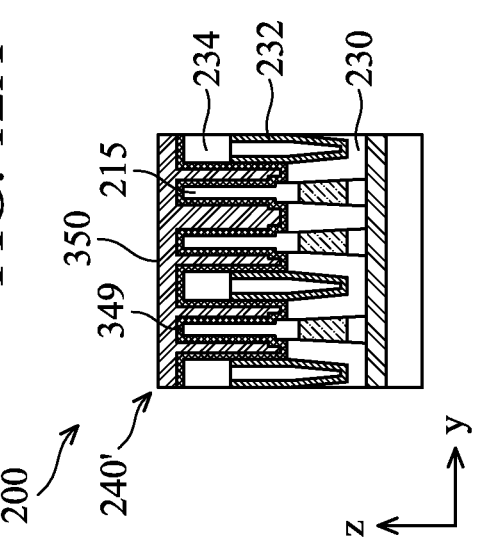
FIG. 12A
FIG. 12B
FIG. 12C
FIG. 12D
FIG. 12E

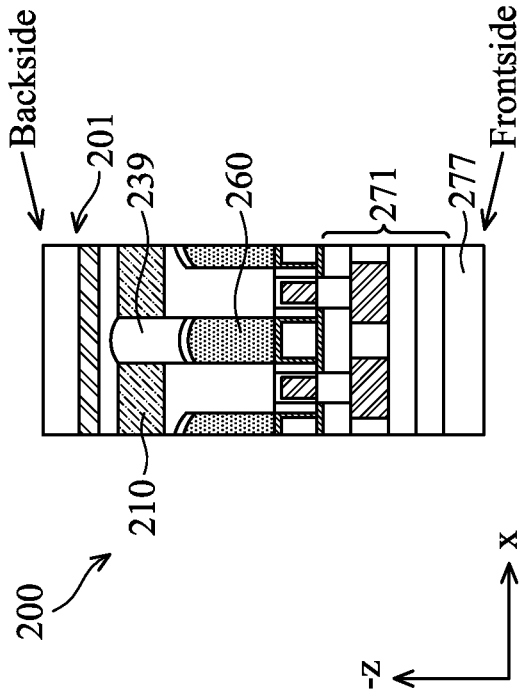
FIG. 14A
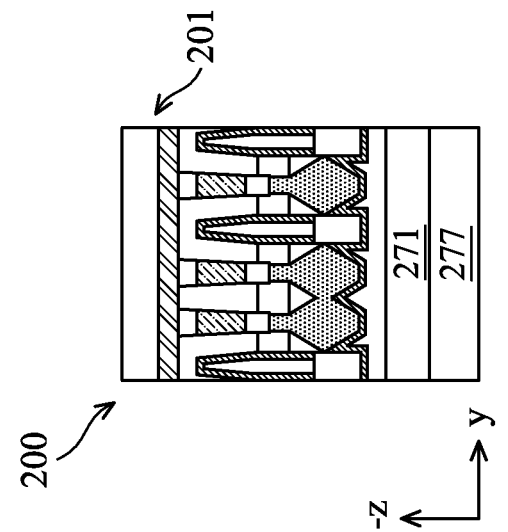
FIG. 14B
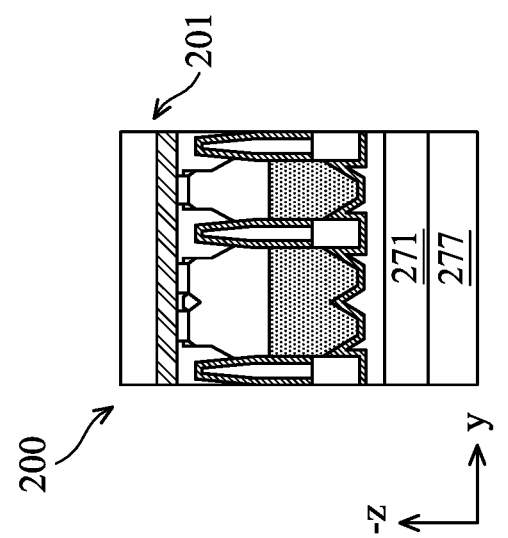
FIG. 14D
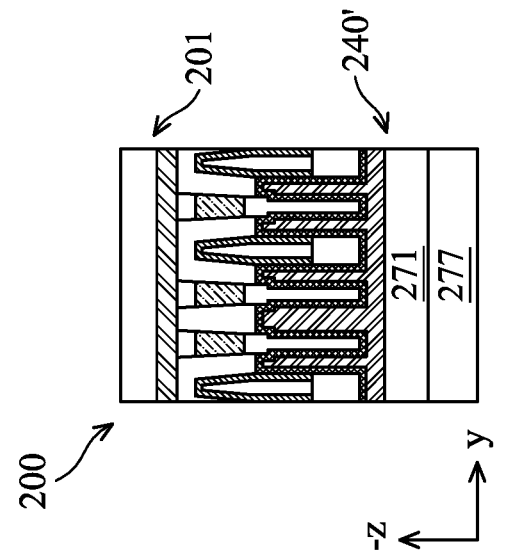
FIG. 14C
FIG. 14E

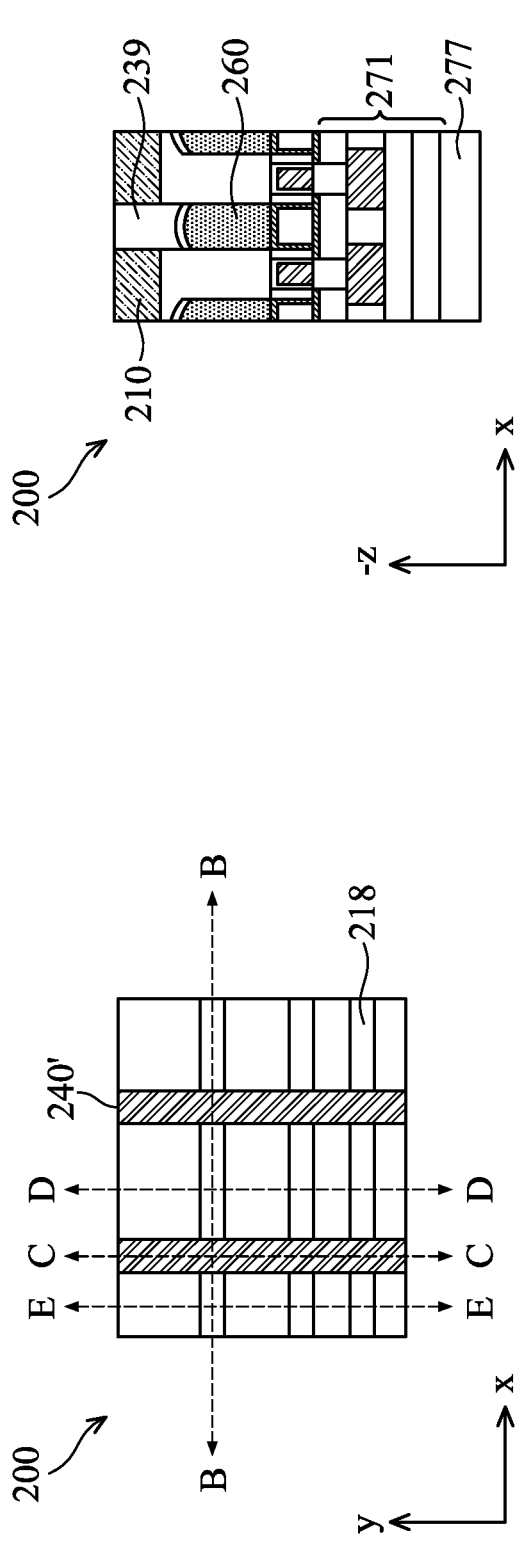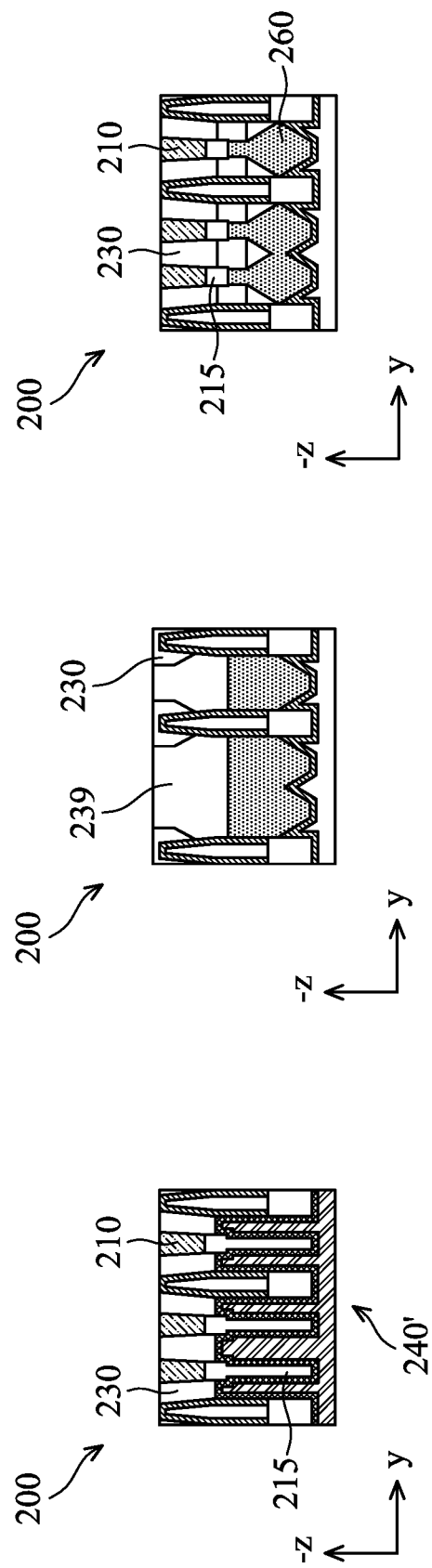
FIG. 15A
FIG. 15B
FIG. 15C
FIG. 15D
FIG. 15E

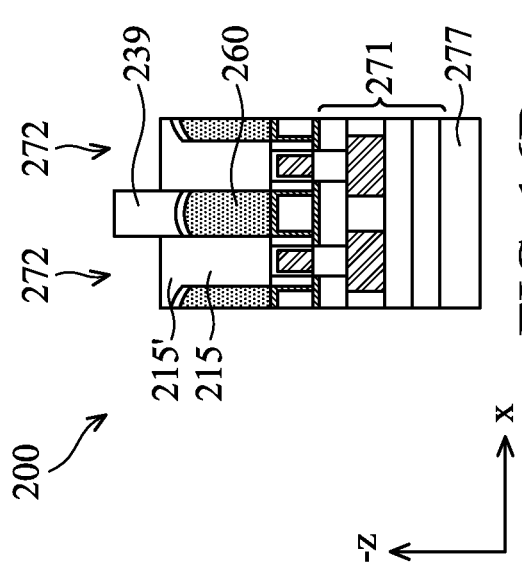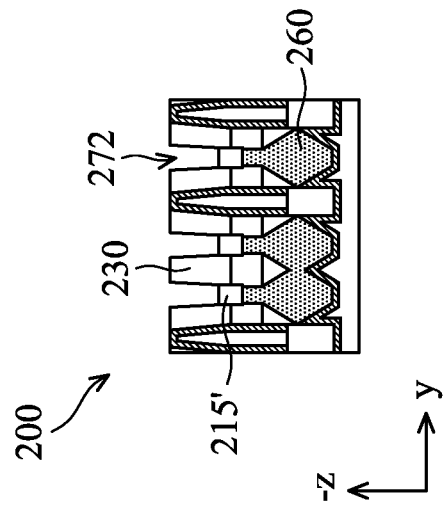
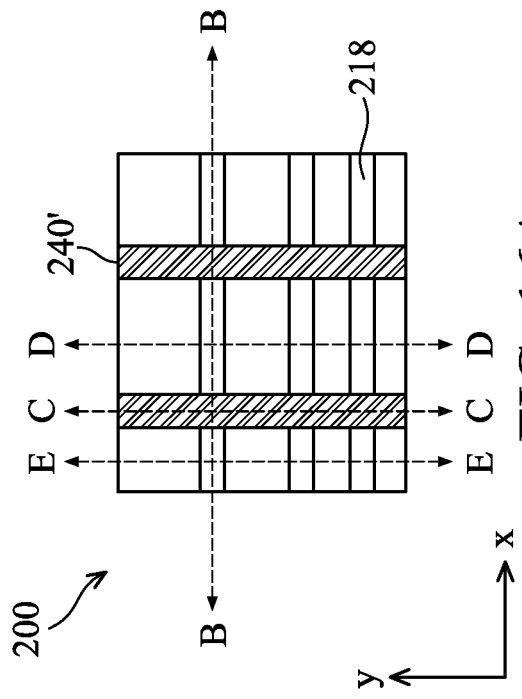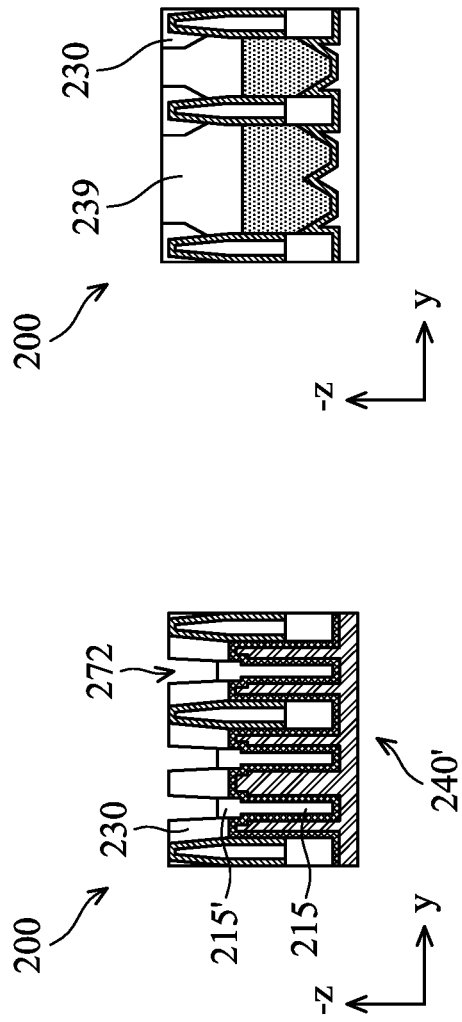
FIG. 16A
FIG. 16B
FIG. 16C
FIG. 16D
FIG. 16E

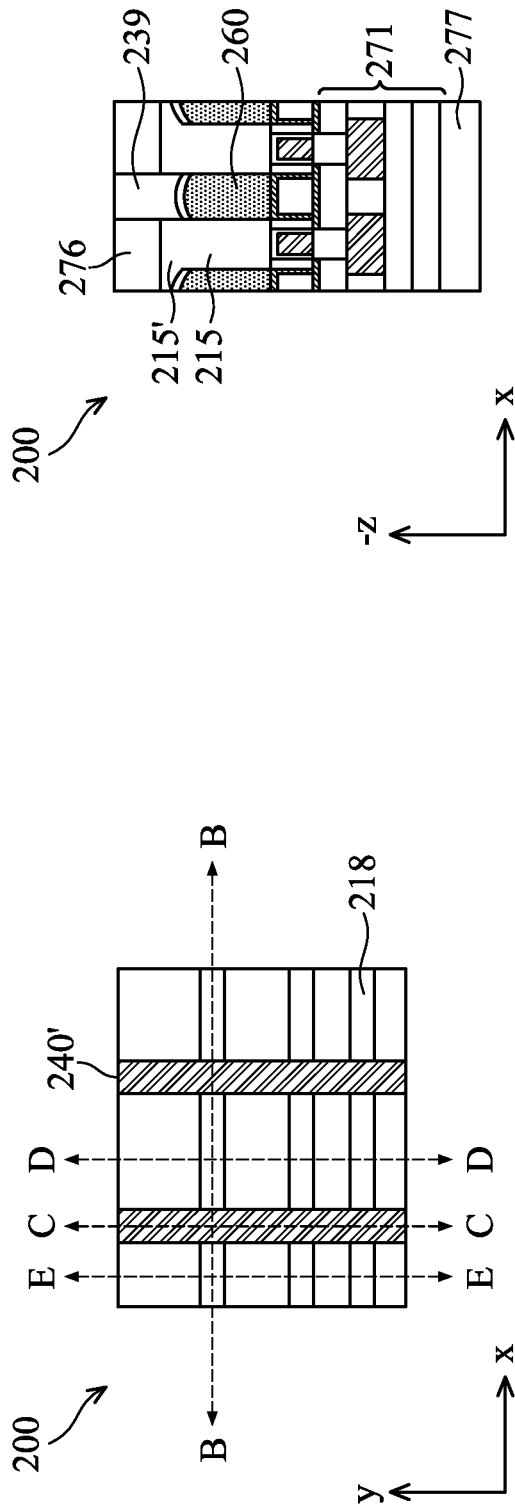
FIG. 17A
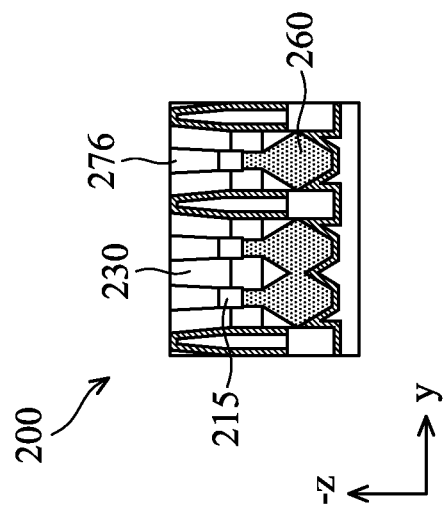
FIG. 17B
FIG. 17C
FIG. 17D
FIG. 17E

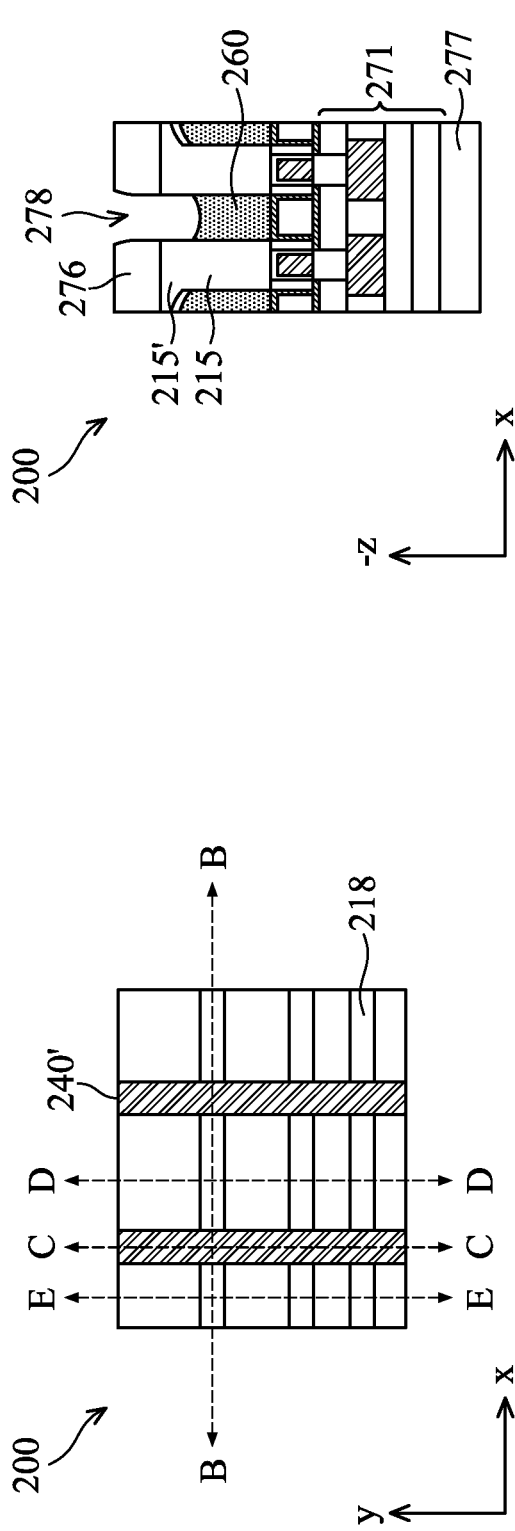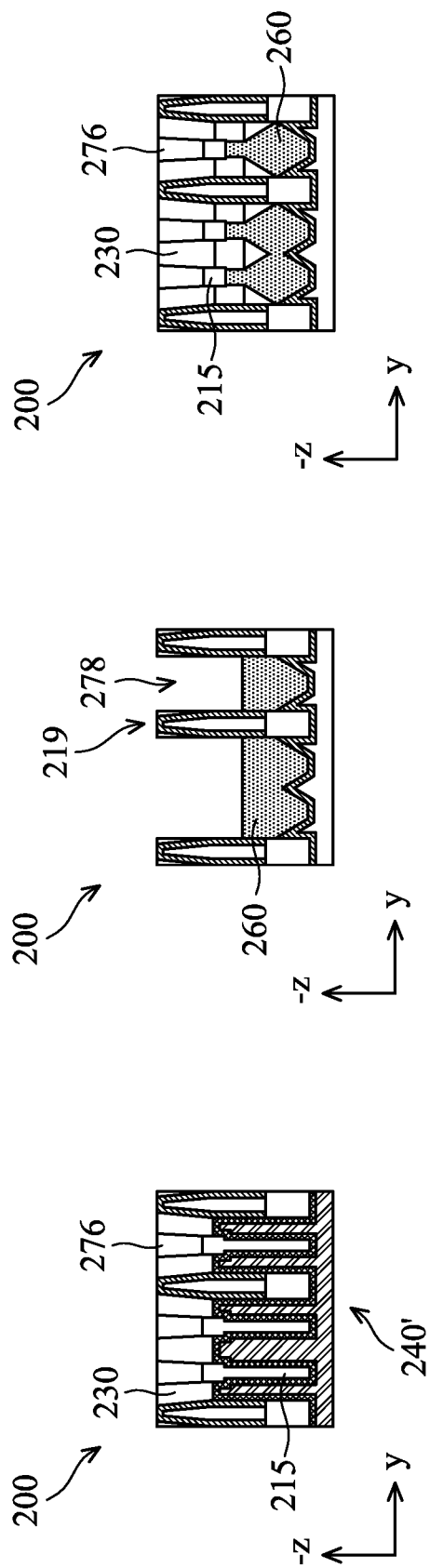

FINFET DEVICES WITH A BACKSIDE POWER RAIL AND A BACKSIDE SELF-ALIGNED VIA DISPOSED BETWEEN DIELECTRIC FINS

PRIORITY

This is a divisional of U.S. application Ser. No. 17/081,894, filed Oct. 27, 2020, which claims the benefits to U.S. Provisional Application Ser. No. 63/002,792 filed Mar. 31, 2020, the entire disclosure of which is incorporated herein by reference.

BACKGROUND

Conventionally, integrated circuits (IC) are built in a stacked-up fashion, having transistors at the lowest level and interconnect (vias and wires) on top of the transistors to provide connectivity to the transistors. Power rails (e.g., metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits. Therefore, although existing approaches in semiconductor fabrication have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2 and 3 illustrate cross-sectional views of a portion of a semiconductor device, according to some embodiments, in intermediate steps of fabrication according to an embodiment of the method of FIGS. 1A-1C.

FIGS. 4A, 5A, 6A, 7A, 8A, 9A, 10A, 11A, 12A, 13A, 14A, 15A, 16A, 17A, 18A, 19A, and 20A illustrate top views of a portion of a semiconductor device, according to some embodiments.

FIGS. 4B, 5B, 5C, 5D, 5E, 5F, 5G, 6B, 6C, 6D, 6E, 7B, 7C, 7D, 7E, 8B, 8C, 8D, 8E, 9B, 9C, 9D, 9E, 10B, 10C, 10D, 10E, 11B, 11C, 11D, 11E, 12B, 12C, 12D, 12E, 13B, 14B, 14C, 14D, 14E, 15B, 15C, 15D, 15E, 16B, 16C, 16D, 16E, 17B, 17C, 17D, 17E, 18B, 18C, 18D, 18E, 19B, 19C, 19D, 19E, and 20B illustrate cross-sectional views of a portion of a semiconductor device, according to some embodiments.

DETAILED DESCRIPTION

Figure 1A:
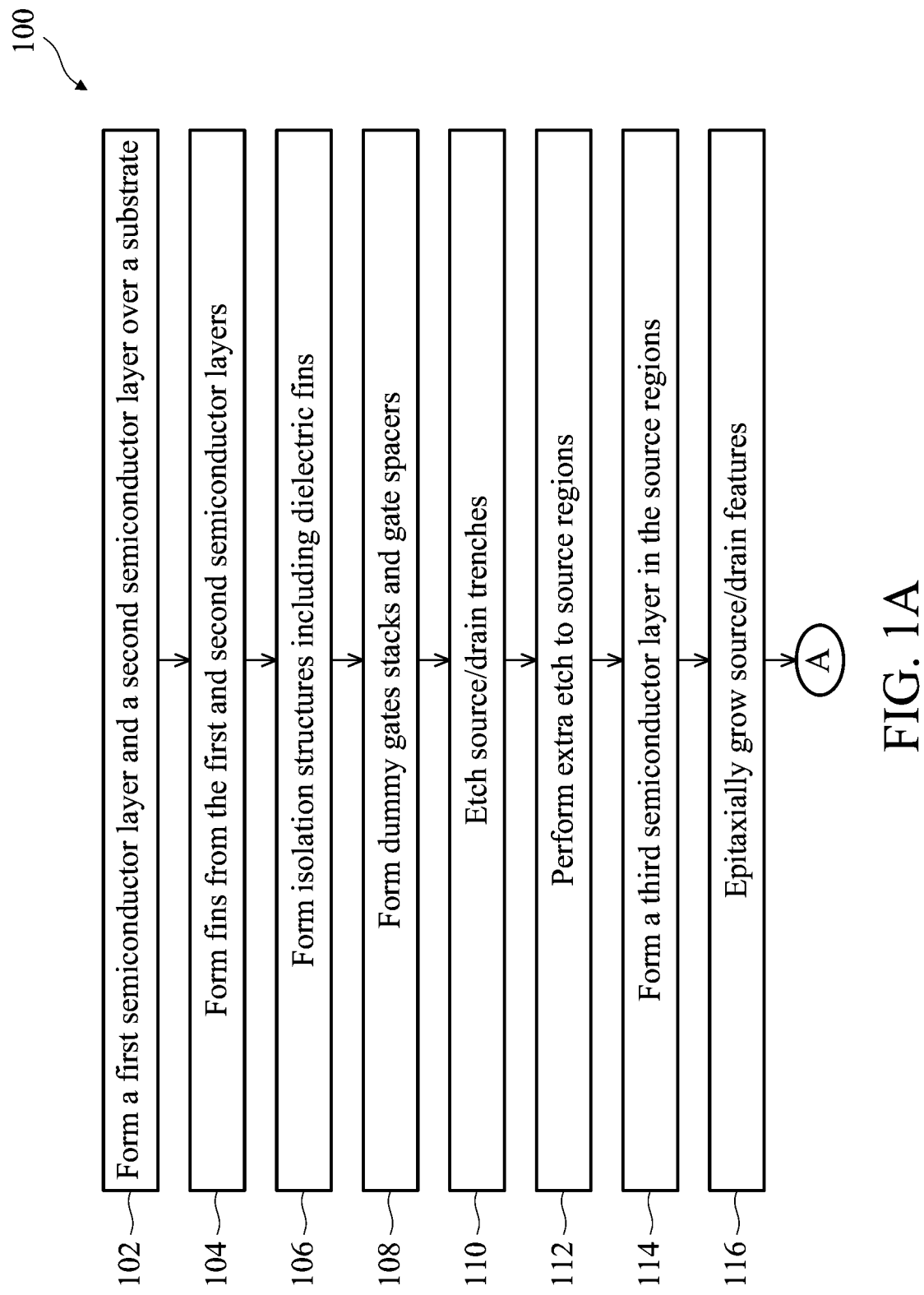
FIGS. 1A, 1B, and 1C show a flow chart of a method of forming a semiconductor device with backside power rails and backside self-aligned vias, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to FinFET devices with backside power rails and backside self-aligned vias. As discussed above, power rails in IC need further improvement in order to provide the needed performance boost as well as reducing power consumption. An object of the present disclosure includes providing power rails (or power routings) on a back side (or backside) of a structure containing FinFET transistors in addition to an interconnect structure (which may include power rails as well) on a front side (or frontside) of the structure. This increases the number of metal tracks available in the structure for directly connecting to source/drain contacts and vias. It also increases the gate density for greater device integration than existing structures without the backside power rails. The backside power rails may have wider dimension than the first level metal (M0) tracks on the frontside of the structure, which beneficially reduces the power rail resistance. The present disclosure also provides structures and methods for isolating the backside power rails from nearby conductors such as metal gates. The details of the structure and fabrication methods of the present disclosure are described below in conjunction with the accompanied drawings, which illustrate a process of making a FinFET device, according to some embodiments. Those of ordinary skill in the art should appreciate that they may readily use the present disclosure as a basis for designing or modifying other processes and structures for carrying out the same purposes and/or achieving the same advantages of the embodiments introduced herein.

Figure 1B:
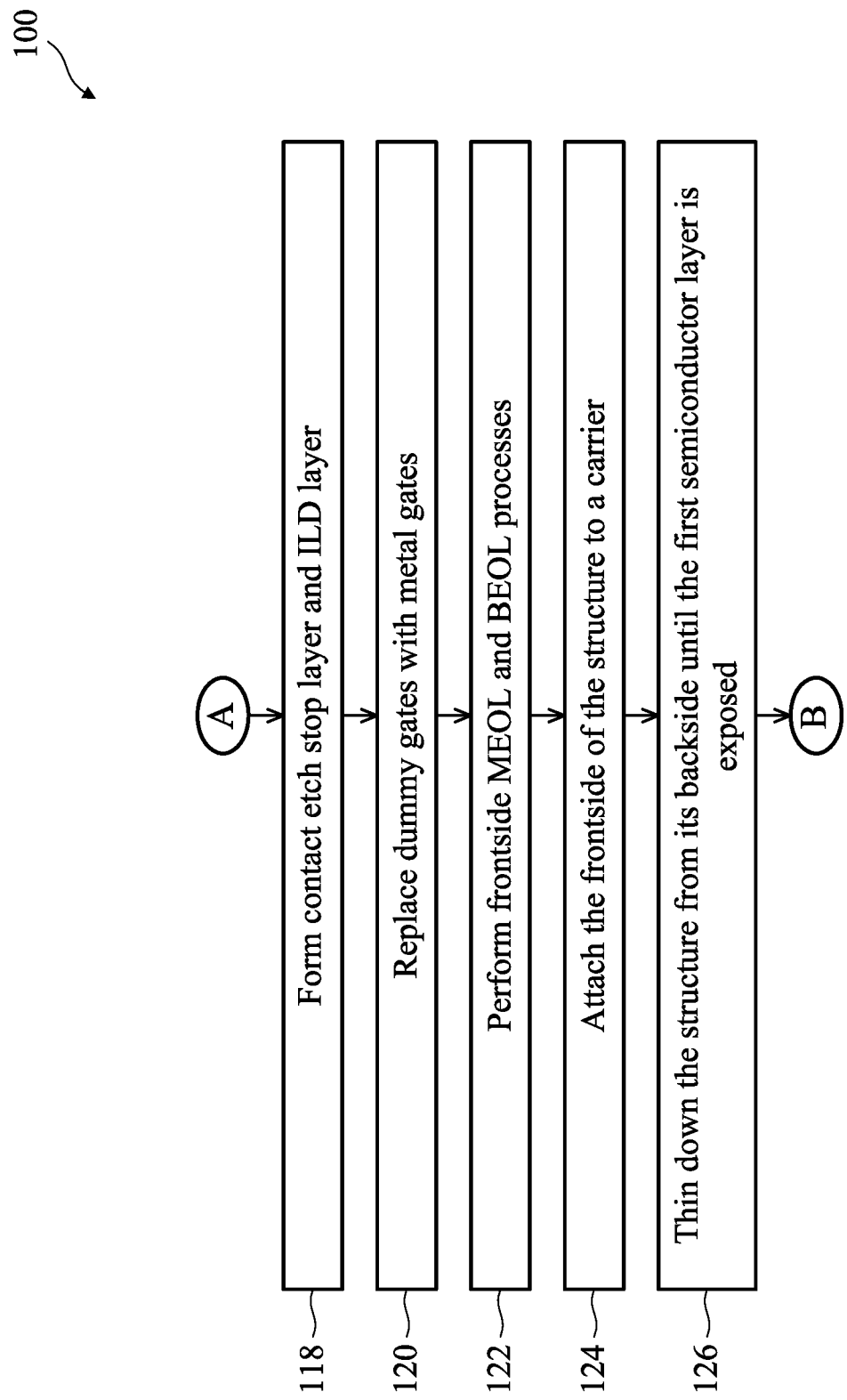
Figure 1C:
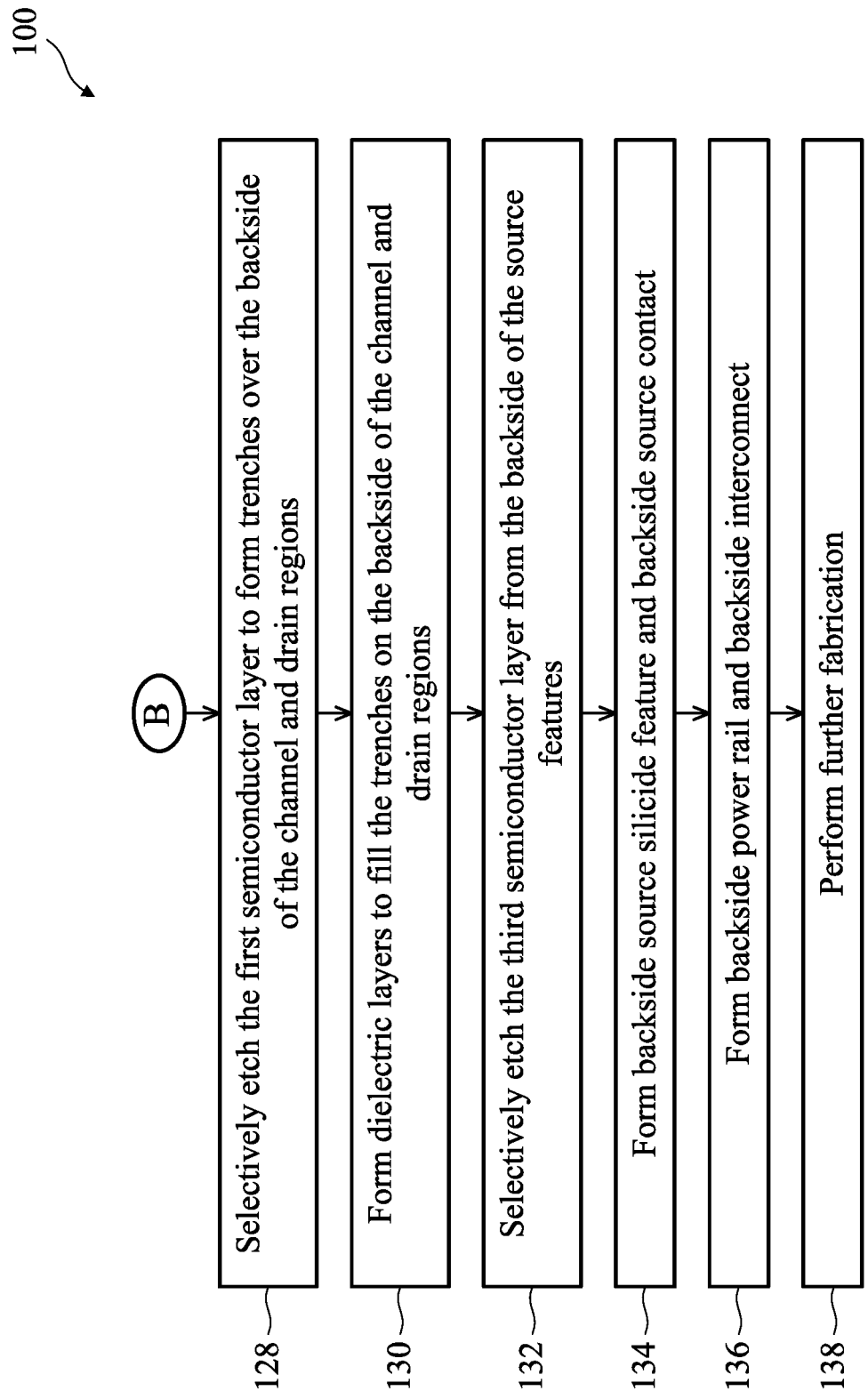

FIGS. 1A, 1B, and 1C are a flow chart of a method 100 for fabricating a semiconductor device according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2 through FIG. 20B that illustrate various top and cross-sectional views of a semiconductor device (or a semiconductor structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2 through 20B have been simplified for the sake of clarity to better understand the inventive concepts of the present disclosure. Additional features can be added in the device 200, and some of the features described below can be replaced, modified, or eliminated in other embodiments of the device 200.

At operation 102, the method 100 (FIG. 1A) forms a semiconductor layer 210 and a semiconductor layer 215 over a substrate 201, such as shown in FIGS. 2 and 3 according to an embodiment. Particularly, FIG. 2 illustrates the substrate 201 in an embodiment, and FIG. 3 illustrates that the semiconductor layer 210 is disposed over the substrate 201 and the semiconductor layer 215 is disposed over the semiconductor layer 210. In the depicted embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate. In the depicted embodiment, the substrate 201 includes a semiconductor layer 204, an insulator 203, and a carrier 202. In embodiments, the semiconductor layer 204 can be silicon, silicon germanium, germanium, or other suitable semiconductor. In the present embodiment, the semiconductor layer 204 includes silicon. In some embodiment, the carrier 202 may be part of a silicon wafer or other suitable carrier wafer. In some embodiment, the insulator 203 may be silicon oxide or other types of insulating material. Semiconductor-on-insulator substrates can be fabricated using separation by implantation of oxygen (SIMOX), wafer bonding, and/or other suitable methods. In an alternative embodiment, the substrate 201 is a bulk silicon substrate (such as including bulk single-crystalline silicon). In yet another alternative embodiment, the substrate 201 is a silicon substrate with a silicon germanium (SiGe) layer acting as a backside stopping layer during silicon etching. The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof.

In some embodiments, the semiconductor layer 210 is epitaxially grown on the semiconductor layer 204, and the semiconductor layer 215 is epitaxially grown on the semiconductor layer 210. In some embodiments, epitaxial growth of semiconductor layers 210 and 215 is achieved by a molecular beam epitaxy (MBE) process, a chemical vapor deposition (CVD) process, a metalorganic chemical vapor deposition (MOCVD) process, other suitable epitaxial growth process, or combinations thereof. A composition of the semiconductor layer 210 is different than a composition of the semiconductor layer 215 to achieve etching selectivity during subsequent processing. In some embodiments, the semiconductor layer 210 has a first etch rate to an etchant and the semiconductor layer 215 has a second etch rate to the etchant, where the second etch rate is less than the first etch rate. In the depicted embodiment, the semiconductor layers 210 and 215 include different materials, constituent atomic percentages, constituent weight percentages, thicknesses, and/or characteristics to achieve desired etching selectivity during an etching process. For example, where the semiconductor layer 210 includes silicon germanium and the semiconductor layer 215 includes silicon, a silicon etch rate of the semiconductor layer 215 is less than a silicon germanium etch rate of the semiconductor layer 210. In some embodiments, the semiconductor layers 210 and 215 can include the same material but with different constituent atomic percentages to achieve the etching selectivity and/or different oxidation rates. For example, the semiconductor layers 210 and 215 can include silicon germanium, where the semiconductor layer 210 has a first silicon atomic percent and/or a first germanium atomic percent and the semiconductor layer 215 has a second, different silicon atomic percent and/or a second, different germanium atomic percent. The present disclosure contemplates that semiconductor layers 210 and 215 include any combination of semiconductor materials that can provide desired etching selectivity, including any of the semiconductor materials disclosed herein. In the depicted embodiment, the semiconductor layer 210 includes silicon germanium and the semiconductor layer 215 include silicon. Further, the semiconductor layer 210 may have a thickness in a range from about 20 nm to about 80 nm, and the semiconductor layer 215 may have a thickness in a range from about 30 nm to about 70 nm, according to some embodiments. As will be discussed the semiconductor layer 210 will be replaced with a backside dielectric layer during wafer backside processing and the backside dielectric layer functions to isolate backside power rails from frontside components such as metal gates and transistor channels. Therefore, the semiconductor layer 210 is designed to have some appropriate thicknesses. If the semiconductor layer 210 is too thin (such as less than 20 nm), the backside dielectric layer may not provide sufficient isolation or the coupling capacitance between the backside power rails and the frontside components may be unacceptably high in some instances. If the semiconductor layer 210 is too thick (such as more than 80 nm), backside vias that connect the backside power rails to frontside S/D features might be long and narrow, leading to unacceptably high resistance in some instances.

In the present embodiment, the semiconductor layer 215 is undoped. In the present embodiment, the semiconductor layer 215 being "undoped" includes embodiments where the semiconductor layer 215 is unintentionally doped or otherwise doped with very low dopant concentration such that it does not contain sufficient carriers (electrons or holes) to be conductive under a typical electric field. As will be discussed, the method 100 will process layers at both sides of the substrate 201. In the present disclosure, the side of the substrate 201 where the semiconductor layer 215 resides is referred to as the frontside and the side opposite the frontside is referred to as the backside.

Figure 4B:
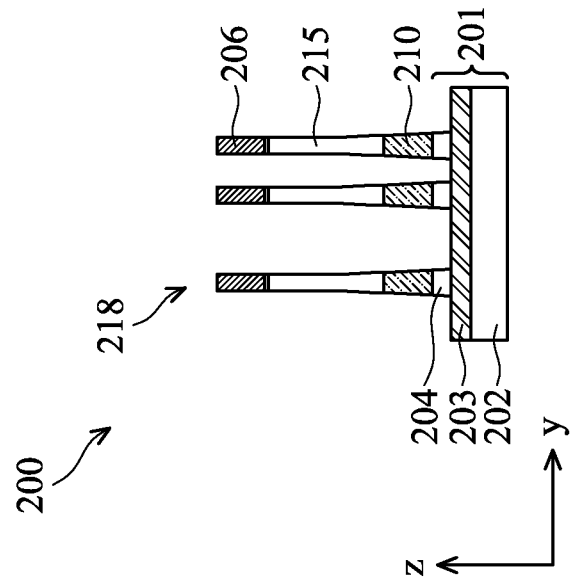
Figure 4A:
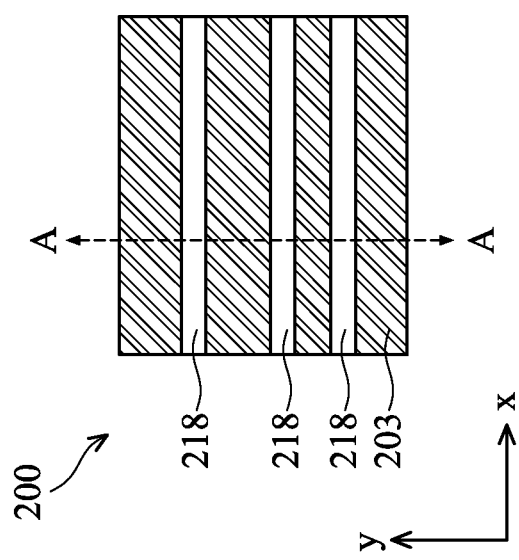

At operation 104, the method 100 (FIG. 1A) forms fins 218 by patterning the semiconductor layers 215 and 210 and the substrate 201. FIG. 4A illustrates a top view of the device 200 with fins 218 oriented along the "x" direction. FIG. 4B illustrates a cross-sectional view of the device 200, in portion, along the A-A line in FIG. 4A. As illustrated in FIG.

4B, the fins 218 include the patterned semiconductor layers 210 and 215, patterned regions 204, and one or more patterned hard mask layers 206. The fins 218 may be patterned by any suitable method. For example, the fin 218 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the semiconductor layer 215 and patterned using a photolithography process. Spacers are formed alongside the patterned sacrificial layer using a self-aligned process. The sacrificial layer is then removed, and the remaining spacers, or mandrels, may then be used as a masking element for patterning the fins 218. For example, the masking element (such as the patterned hard mask 206) may be used for etching recesses into the semiconductor layers 215 and 210 and the substrate 201, leaving the fins 218 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 218 may be suitable.

At operation 106, the method 100 (FIG. 1A) forms various isolation structures over the substrate 201 and isolate the fins 218, an embodiment of which is illustrated in FIGS. 5A-5G. FIG. 5A illustrates a top view of the device 200, and FIGS. 5B-5G illustrate cross-sectional views of the device 200, in portion, along the A-A line in FIG. 5A at various steps of the operation 106.

Referring to FIG. 5B, an isolation feature 230 is deposited over the substrate 201 and the fins 218 to separate and isolate the fins 218 from each other. In the present embodiment, for fins 218 in dense fin areas (such as the two fins 218 on the right side of FIG. 5B), the isolation feature 230 fully fills the space between the adjacent fins 218; and for fins 218 in less dense fin areas (or isolated fin areas) (such as the two fins 218 on the left side of FIG. 5B), the isolation feature 230 partially fills the space between the adjacent fins 218. In various embodiments, the isolation feature 230 may be deposited to a thickness about 5 nm to about 40 nm. In the present embodiment, the isolation feature 230 includes silicon oxide. The isolation feature 230 may alternatively or additionally include silicon nitride, silicon oxynitride, other suitable isolation material (for example, including silicon, oxygen, nitrogen, carbon, or other suitable isolation constituent), or combinations thereof. Isolation feature 230 may be deposited using CVD, PVD, ALD, HDPCVD, MOCVD, RPCVD, PECVD, LPCVD, ALCVD, APCVD, other suitable methods, or combinations thereof.

Referring to FIG. 5C, a dielectric liner 232 is deposited over the isolation feature 230, a dielectric fill layer 233 is deposited over the dielectric liner 232 and fills the gaps between the fins 218 in the isolated fin areas, and the dielectric fill layer 233 is subsequently etched back to a level that is below the top surface of the semiconductor layer 215 in the fins 218. In an embodiment, the dielectric liner 232 includes a low-k dielectric material such as a dielectric material including Si, O, N, and C. Exemplary low-k dielectric materials include fluoride-doped silica glass (FSG), carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, or combinations thereof. Low-k dielectric material generally refers to dielectric materials having a low dielectric constant, for example, lower than about 6.0. The dielectric liner 232 may be deposited using CVD, PVD, ALD, HDPCVD, MOCVD, RPCVD, PECVD, LPCVD, ALCVD, APCVD, other suitable methods, or combinations thereof. In an embodiment, the dielectric fill layer 233 includes silicon oxide, silicon nitride, silicon oxynitride, TEOS formed oxide, PSG, BPSG, low-k dielectric material, other suitable dielectric material, or combinations thereof. The dielectric fill layer 233 may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 233 may be deposited using other types of methods discussed in the present disclosure. The etching back of the dielectric fill layer 233 uses an etching process that is selective to the material of the dielectric fill layer 233 and with no (or minimal) etching to the dielectric liner 232.

Referring to FIG. 5D, the dielectric liner 232 is etched back (or trimmed) to the same level as the dielectric fill layer 233. The etching back of the dielectric liner 232 uses an etching process that is selective to the material of the dielectric liner 232 and with no (or minimal) etching to the dielectric fill layer 233 and the isolation feature 230.

Referring to FIG. 5E, a dielectric helmet 234 is deposited over the dielectric layers 232 and 233 and between the isolation feature 230 on opposing sidewalls of the fins 218 in the isolated fin areas. In an embodiment, the dielectric helmet 234 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9) such as greater than 6.0. The dielectric helmet 234 is formed by any of the processes described herein, such as ALD, CVD, PVD, oxidation-based deposition process, other suitable process, or combinations thereof.

Referring to FIG. 5F, the operation 106 deposits a sacrificial oxide layer (not shown) to fill the various gaps in the device 200 and then performs a CMP process. The CMP process removes the sacrificial oxide layer and the hard mask layer 206, and planarizes the top surface of the device 200. The dielectric helmet 234, the semiconductor layer 215, and the isolation feature 230 may be partially removed by the CMP process in some embodiments.

Referring to FIG. 5G, the operation 106 recesses the isolation feature 230 to a level that is just above the semiconductor layer 210. The operation 106 may apply one or more etching processes that are selective to the isolation feature 230 and with no (or minimal) etching to the dielectric helmet 234, the semiconductor layer 215, and the dielectric liner 232. The selective etching processes can be dry etching, wet drying, reactive ion etching, or other suitable etching methods. As a result, the device 200 is provided with dielectric fins 219 disposed between semiconductor fins 218 in the isolated fin areas. The dielectric fins 219 include the dielectric helmet 234, the dielectric liner 232, and the dielectric fill layer 233. The isolation feature 230 is disposed between lower portions of the semiconductor fins 218 and the dielectric fins 219.

At operation 108, the method 100 (FIG. 1A) forms gate stacks 240 over the fins 218 and the isolation structures 230 and 219. The resultant structure is shown in FIGS. 6A-6E according to an embodiment. FIG. 6A illustrates a top view of the device 200. FIGS. 6B, 6C, 6D, and 6E illustrate cross-sectional views of the device 200, in portion, along the B-B line, the C-C line, the D-D line, and the E-E line in FIG. 6A, respectively. Particularly, the D-D line is cut into the source regions of the transistors and is parallel to the gate stacks 240, and the E-E line is cut into the drain regions of the transistors and is parallel to the gate stacks 240. The D-D lines and the E-E lines in FIGS. 7A-12A and 14A-19A are similarly configured.

From the top view, the gate stacks 240 are oriented lengthwise generally along the "y" direction perpendicular to the "x" direction. In the present embodiment, the gate stacks 240 are dummy (or sacrificial) gate stacks and will be replaced with functional gate stacks 240' in a later step. In the present embodiment, the gate stacks 240 include a dummy gate dielectric layer 235, a dummy gate electrode layer 245 over the dummy gate dielectric layer 235, and one or more hard mask layers 246 over the dummy gate electrode layer 245. In some embodiments, the dummy gate dielectric 235 includes a dielectric material, such as silicon oxide, a high-k dielectric material, other suitable dielectric material, or combinations thereof; the dummy gate electrode layer 245 includes polysilicon or other suitable material; and the one or more hard mask layers 246 include silicon oxide, silicon nitride, or other suitable materials. The dummy gate stacks 240 may be formed by deposition processes, lithography processes, etching processes, other suitable processes, or combinations thereof. For example, the dummy gate dielectric layer 235, the dummy gate electrode layer 245, and the hard mask layers 246 may be deposited by various deposition processes such as CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. A lithography patterning and etching process is then performed to pattern the one or more hard mask layers 246, the dummy gate electrode layer 245, and the dummy gate dielectric layer 235 to form dummy gate stacks 240, as depicted in FIG. 6B. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

The operation 108 further forms gate spacers 247 on sidewalls of the dummy gate stacks 240 (such as shown in FIG. 6B) and fin sidewall spacers 248 on lower portion of the sidewalls of the fins 218 (such as shown in FIGS. 6D and 6E). The gate spacers 247 and fin sidewall spacers 248 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 240 and fins 218 and subsequently etched (e.g., anisotropically etched) to form gate spacers 247 and fin sidewall spacers 248. In some embodiments, gate spacers 247 and fin sidewall spacers 248 include a multi-layer structure, such as a first dielectric layer that includes silicon nitride and a second dielectric layer that includes silicon oxide. In some embodiments, the fin sidewall spacers 248 are omitted (or removed) from the device 200.

At operation 110, the method 100 (FIG. 1A) forms source/drain (S/D) trenches 250 by etching the fins 218 adjacent the gate spacers 247. The resultant structure is shown in FIGS. 7A-7E according to an embodiment. FIG. 7A illustrates a top view of the device 200, and FIGS. 7B, 7C, 7D, and 7E illustrate cross-sectional views of the device 200, in portion, along the B-B line, the C-C line, the D-D line, and the E-E line in FIG. 7A, respectively.

In the depicted embodiment, an etching process partially removes the semiconductor layer 215 in source/drain regions of fins 218 and leaves only a portion of the semiconductor layer 215 remains in the source/drain trenches 250. The remaining portion of the semiconductor layer 215 is referred to as portion 215' or semiconductor layer 215'. The portion 215' has a thickness "d1" along the "z" direction. In an embodiment, the thickness d1 is in a range of about 5 nm to about 15 nm. As will be discussed later, the portion 215' provides certain isolation between the drain region and the backside power rail. Therefore, the range of thickness d1 is designed to achieve that purpose. If d1 is too small (for example, less than 5 nm), then the drain feature may be inadvertently etched when forming backside isolation. If d1 is too large (for example, greater than 15 nm), then the source/drain trench 250 may be too shallow and the source/drain features formed therein may be too small to achieve good device performance. As a result of the etching process, the source/drain trenches 250 have bottom and sidewalls defined by the semiconductor layer 215. The etching process can include a dry etching process, a wet etching process, other suitable etching process, or combinations thereof. In some embodiments, parameters of the etching process are configured to selectively etch the semiconductor layer 215 and with minimal (to no) etching of the gate stacks 240 (which includes the hard mask 246 at its top), the gate spacers 247, the dielectric fins 219, and the fin sidewall spacers 248 if present.

At operation 112, the method 100 (FIG. 1A) performs extra etching to the source region of the device 200. The resultant structure is shown in FIGS. 8A-8E according to an embodiment. FIG. 8A illustrates a top view of the device 200, and FIGS. 8B, 8C, 8D, and 8E illustrate cross-sectional views of the device 200, in portion, along the B-B line, the C-C line, the D-D line, and the E-E line in FIG. 8A, respectively.

In the depicted embodiment, the operation 112 forms an etch mask 241 that includes a patterned hard mask 236 and a patterned resist 237. The etch mask 241 covers the device 200 except the source regions, which are exposed through openings 238 in the etch mask 241. Then, the operation 112 etches the source regions through the semiconductor layer 210 and into the substrate 201 until only a thin layer 204 remains in the source trench 250, thereby extending the source trench 250 into the substrate 201. As a result of this etching process, a semiconductor fin 218 is separated into two fins or two fin segments (one fin segment on the left of trench 250 in FIG. 8B and another fin segment on the right of trench 250 in FIG. 8B). The etching process may include dry etching, wet etching, reactive ion etching, or other suitable etching. The etching process is substantially anisotropic (i.e., substantially vertical) in this embodiment. Also, the etching process may be tuned selective to the material of the semiconductor layers 215 and 210 and with no (or minimal) etching to the gate spacers 247 and gate hard mask layers 246. The etching process may be first tuned selective to the material of the semiconductor layer 215 and then tuned selective to the material of the semiconductor layer 210 and with no (or minimal) etching to the gate spacers 247 and gate hard mask layers 246. In the present embodiment, the fin sidewall spacers 248 are removed during the operation 112. In some embodiments, even though the fin sidewall spacers 248 and the gate spacers 247 include the same material, the fin sidewall spacers 248 can be removed by the operation 112 while the gate spacers 247 substantially remain because the fin sidewall spacers 248 are much thinner than the gate spacers 247 along the "z" direction. After the etching process finishes, the operation 112 removes the patterned resist 237, for example, by a stripping process.

At operation 114, the method 100 (FIG. 1A) forms a semiconductor layer 239 in the source trenches 250. The resultant structure is shown in FIGS. 9A-9E according to an embodiment. FIG. 9A illustrates a top view of the device 200, and FIGS. 9B, 9C, 9D, and 9E illustrate cross-sectional views of the device 200, in portion, along the B-B line, the C-C line, the D-D line, and the E-E line in FIG. 9A, respectively.

The semiconductor layer 239 may be deposited using an epitaxial growth process or by other suitable processes. For example, the semiconductor layer 239 may be epitaxially grown from the surfaces of the layers 204, 210, and 215. In some embodiments, epitaxial growth of semiconductor layers 239 is achieved by a molecular beam epitaxy (MBE) process, a chemical vapor deposition (CVD) process, a metalorganic chemical vapor deposition (MOCVD) process, other suitable epitaxial growth process, or combinations thereof. The semiconductor layer 239 includes a semiconductor material that is different than the semiconductor material included in the semiconductor layer 210 to achieve etching selectivity during subsequent processing. For example, semiconductor layers 239 and 210 may include different materials, different constituent atomic percentages, different constituent weight percentages, and/or other characteristics to achieve desired etching selectivity during an etching process. In an embodiment, the semiconductor layer 239 includes silicon and the semiconductor layer 210 includes silicon germanium. In another embodiment, semiconductor layers 239 and 210 can both include silicon germanium, but with different silicon atomic percent. The present disclosure contemplates that semiconductor layers 239 and 210 include any combination of semiconductor materials that can provide desired etching selectivity, including any of the semiconductor materials disclosed herein. In a further embodiment, the semiconductor layer 239 is undoped, such as having undoped silicon (including unintentionally doped or otherwise doped with very low dopant concentration such that it does not contain sufficient carriers (electrons or holes) to be conductive under a typical electric field). Since the drain regions (FIG. 9E) are covered by the patterned hard mask layer 236, the semiconductor layer 239 is only deposited in the source regions (FIG. 9D). The semiconductor layer 239 is deposited to a thickness such that its top surface is above the semiconductor layer 210 (FIG. 9B) by a thickness d2. In an embodiment, d2 is about equals to d1. In various embodiments, d2 is in a range of about 5 nm to about 15 nm. The operation 114 may include an etching process that recesses the semiconductor layer 239 to the level shown in FIG. 9B if the semiconductor layer 239 is initially grown taller than that. If the semiconductor layer 239 is too thick (for example, d2 is greater than 15 nm), the source feature 260 (see FIG. 10B) formed thereon might be too small to achieve good device performance. As will be discussed later, the semiconductor layer 239 is replaced with a backside self-aligned contact 282 (see FIG. 19B) in a later step. If the semiconductor layer 239 is too thin (for example, d2 is less than 5 nm), there might not be sufficient room for forming the backside self-aligned contact. In dense fin areas (such as the source trench 250 on the right side in FIG. 9D), the semiconductor layer 239 grown from adjacent fins may merge into one larger epitaxial layer. Further, in the present embodiment, an isotropic pre-clean process is performed before epitaxially growing the semiconductor layer 239, and the pre-clean process recesses the isolation feature 230 exposed by the source/drain trenches 250. Within the trenches 250, the isolation feature 230 may be partially or completely removed. In some embodiment, a void 239's may appear between the merged semiconductor layer 239 and the recessed isolation feature 230 within the trench 250, such as shown in FIG. 9D. After the semiconductor layer 239 is deposited, the operation 114 removes the patterned hard mask layer 236 by one or more etching processes. As will be discussed below, the extra etching in the operation 112 and the growing of the semiconductor layer 239 in the operation 114 can be performed in source regions only, drain regions only, or in both source and drain regions in various embodiments.

At operation 116, the method 100 (FIG. 1A) epitaxially grows semiconductor S/D features 260 in the S/D trenches 250. The resultant structure is shown in FIGS. 10A-10E according to an embodiment. FIG. 10A illustrates a top view of the device 200, and FIGS. 10B, 10C, 10D, and 10E illustrate cross-sectional views of the device 200, in portion, along the B-B line, the C-C line, the D-D line, and the E-E line in FIG. 10A, respectively.

As shown in FIGS. 10B, 10D, and 10E, epitaxial S/D features 260 are grown from the semiconductor layers 215 and 239 in the source trench 250 and from the semiconductor layers 215 in the drain trench 250. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 239 and 215. Epitaxial S/D features 260 are doped with n-type dopants for n-type transistors or p-type dopants for p-type transistors. In some embodiments, for n-type transistors, epitaxial S/D features 260 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 260 include silicon germanium or germanium and can be doped with boron, other p-type dopant, or combinations thereof (for example, forming Si:Ge:B epitaxial source/drain features). In some embodiments, epitaxial S/D features 260 include more than one epitaxial semiconductor layer, where the epitaxial semiconductor layers can include the same or different materials and/or dopant concentrations. Further, in an embodiment, the S/D feature 260 (or at least its portion adjoining to the semiconductor layer 239) includes a different material composition than the semiconductor layer 239 to achieve etch selectivity during backside via formation process. For example, in an embodiment, the semiconductor layer 239 include SiGe and the S/D feature 260 includes Si (for n-type transistor). For example, in another embodiment, the semiconductor layer 239 include SiGe with a first Ge atomic percent and the S/D feature 260 includes SiGe (for p-type transistor) with a second Ge atomic percent and the first and the second Ge atomic percent are different. In some embodiments, epitaxial S/D features 260 include materials and/or dopants that achieve desired tensile stress and/or compressive stress in respective channel regions. In some embodiments, epitaxial source/drain features 260 are doped during deposition by adding impurities to a source material of the epitaxy process (i.e., in-situ). In some embodiments, epitaxial source/drain features 260 are doped by an ion implantation process subsequent to a deposition process. In some embodiments, annealing processes (e.g., rapid thermal annealing (RTA) and/or laser annealing) are performed to activate dopants in epitaxial source/drain features 260. In some embodiments, epitaxial source/drain features 260 are formed in separate processing sequences that include, for example, masking p-type transistor regions when forming epitaxial source/drain features 260 in n-type transistor regions and masking n-type transistor regions when forming epitaxial source/drain features 260 in p-type transistor regions. As shown in FIG. 10D, the source features 260 are formed into bar-like shapes and fully fill the bottom portion of the source trenches 250. Due to the presence of the semiconductor layer 239, the bottom of the source features 260 are wider than the top of the source features 260. The sidewalls of the source features 260 contact the sidewalls of adjacent dielectric fins 219. The source features 260 in the dense fin areas (for example, the two source features 260 on the right side of FIG. 10D) merge into one large piece of epitaxial semiconductor material. As shown in FIG. 10E, the drain features 260 have narrow bottom portion constrained by fin sidewall spacers 248. As the drain features 260 grow above the fin sidewall spacers 248, they expand laterally, forming a diamond-shaped top portion. The drain features 260 in the dense fin areas (for example, the two drain features 260 on the right side of FIG. 10E) also merge, resulting a void between the drain feature 260 and the fin sidewall spacer 248 in the present embodiment. In the depicted embodiment, the source features 260 (FIG. 10D) have larger volume than the drain features 260 (FIG. 10E) due to the presence of the semiconductor layer 239 in the source region but not in the drain region. As will be shown later, the large source features provide for reduced contact resistance both to the frontside source contact and backside source contact.

At operation 118, the method 100 (FIG. 1B) forms a contact etch stop layer (CESL) 269 and an inter-layer dielectric (ILD) layer 270. The resultant structure is shown in FIGS. 11A-11E according to an embodiment. FIG. 11A illustrates a top view of the device 200, and FIGS. 11B, 11C, 11D, and 11E illustrate cross-sectional views of the device 200, in portion, along the B-B line, the C-C line, the D-D line, and the E-E line in FIG. 11A, respectively.

As shown in FIGS. 11B-11E, the CESL 269 is deposited over the S/D features 260, the dielectric fins 219, the dummy gate stack 240, and the gate spacer 247. The ILD layer 270 is deposited over the CESL 269 and fills the space between opposing gate spacers 247. The CESL 269 includes a material that is different than ILD layer 270. In some embodiments, the CESL 269 includes a material that is different than the dielectric layer 234. The CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods.

At operation 120, the method 100 (FIG. 1B) replaces the dummy gate stacks 240 with functional gate stacks 240' (such as high-k metal gates). The resultant structure is shown in FIGS. 12A-12E according to an embodiment. FIG. 12A illustrates a top view of the device 200, and FIGS. 12B, 12C, 12D, and 12E illustrate cross-sectional views of the device 200, in portion, along the B-B line, the C-C line, the D-D line, and the E-E line in FIG. 12A, respectively. This involves a variety of processes as briefly described below.

First, the operation 120 performs a CMP process and/or other planarization process to the ILD layer 270 and the CESL 269 until a top portion of dummy gate stacks 240 is exposed. In some embodiments, the planarization process removes hard mask layers 246 of dummy gate stacks 240 to expose underlying dummy gate electrodes 245, such as polysilicon gate electrode layers.

Then, the operation 120 removes the dummy gate stacks 240 (the dummy gate electrodes 245 and the dummy gate dielectric layer 235, see FIG. 6B) using one or more etching process. This forms a gate trench, and a channel region of the semiconductor layer 215 are exposed in the gate trench. The etching process may be a dry etching process, a wet etching process, other suitable etching process, or combinations thereof. In some embodiments, the etching process is a multi-step etch process. For example, the etching process may alternate etchants to separately remove various layers of dummy gate stacks 240. In some embodiments, the etching process is configured to selectively etch dummy gate stacks 240 with minimal (to no) etching of other features of the device 200, such as ILD layer 270, gate spacers 247, isolation features 230, dielectric layers 232 and 234, and the semiconductor layer 215.

Next, the operation 120 forms a gate dielectric layer 349 on top and sidewalls of the semiconductor layers 215 and forms a gate electrode 350 over the gate dielectric layer 349. The functional gate stack 240' comprises the gate dielectric layer 349 and the gate electrode 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 349 may be formed by chemical oxidation, thermal oxidation, atomic layer deposition (ALD), chemical vapor deposition (CVD), and/or other suitable methods. In some embodiments, the gate stack 240' further includes an interfacial layer between the gate dielectric layer 349 and the semiconductor layer 215. The interfacial layer may include silicon dioxide, silicon oxynitride, or other suitable materials. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240' includes a high-k dielectric layer and metal layer(s), it is also referred to as a high-k metal gate.

Figure 13B:
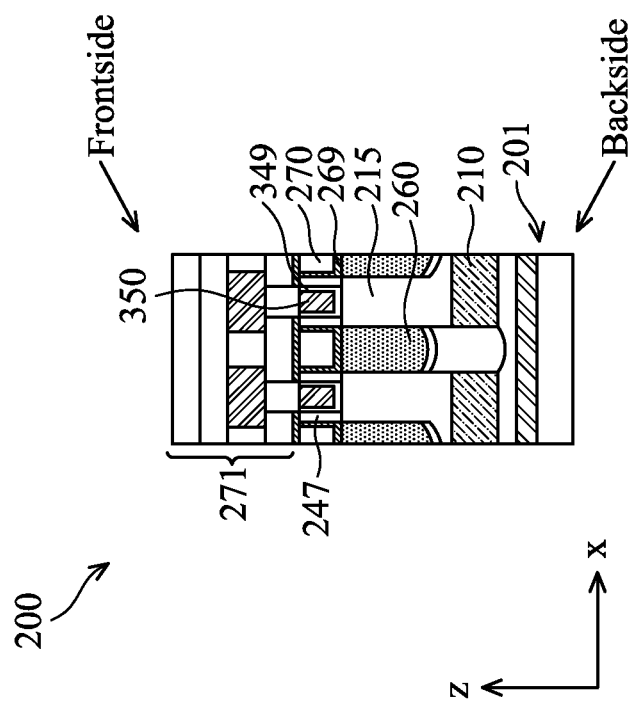
Figure 13A:
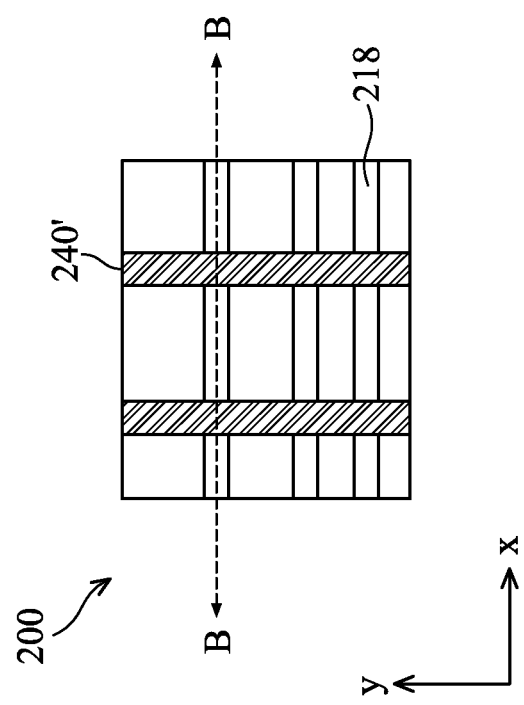

At operation 122, the method 100 (FIG. 1B) performs various fabrication processes at the frontside of the device 200 including mid-end-of-line (MEOL) processes and back-end-of-line (BEOL) processes. For example, the operation 122 may form frontside silicide features on the S/D features 260, form frontside S/D contacts on the silicide features, form S/D contact vias connecting to the S/D contacts, form gate vias connecting to the gate stacks 240', and form one or more interconnect layers with wires and vias embedded in dielectric layers. The one or more interconnect layers connecting gate, source, and drain electrodes of various transistors, as well as other circuits in the device 200, to form an integrated circuit in part or in whole. The operation 122 may also form passivation layers on the interconnect layers. In the embodiment depicted in FIGS. 13A and 13B (FIG. 13B illustrates a cross-sectional view of the device 200, in portion, along the B-B line in FIG. 13A), the reference numeral 271 denotes the various features at the frontside of the device 200, as discussed above.

At operation 124, the method 100 (FIG. 1B) flips the device 200 upside down and attaches the frontside of the device 200 to a carrier 277, such as shown in FIG. 14B. FIG. 14A illustrates a top view of the device 200, and FIGS. 14B, 14C, 14D, and 14E illustrate cross-sectional views of the device 200, in portion, along the B-B line, the C-C line, the D-D line, and the E-E line in FIG. 14A, respectively. This makes the device 200 accessible from the backside of the device 200 for further processing. The operation 124 may use any suitable attaching processes, such as direct bonding, hybrid bonding, using adhesive, or other bonding methods. The operation 124 may further include alignment, annealing, and/or other processes. The carrier 277 may be a silicon wafer in some embodiment. In FIGS. 14B-14E (as well as in other figures to be described below), the "z" direction points from the backside of the device 200 to the frontside of the device 200, while the "−z" direction points from the frontside of the device 200 to the backside of the device 200.

At operation 126, the method 100 (FIG. 1B) thins down the device 200 from the backside of the device 200 until the isolation features 230, the semiconductor layer 210, and the semiconductor layer 239 are exposed from the backside of the device 200. The resultant structure is shown in FIGS. 15A-15E according to an embodiment. FIG. 15A illustrates a top view of the device 200, and FIGS. 15B, 15C, 15D, and 15E illustrate cross-sectional views of the device 200, in portion, along the B-B line, the C-C line, the D-D line, and the E-E line in FIG. 15A, respectively. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

At operation 128, the method 100 (FIG. 1C) selectively etches the semiconductor layer 210 to form trenches 272 over the backside of the gate stacks 240' and the drain features 260. The resultant structure is shown in FIGS. 16A-16E according to an embodiment. FIG. 16A illustrates a top view of the device 200, and FIGS. 16B, 16C, 16D, and 16E illustrate cross-sectional views of the device 200, in portion, along the B-B line, the C-C line, the D-D line, and the E-E line in FIG. 16A, respectively. In the present embodiment, the operation 128 applies an etching process that is tuned to be selective to the materials of the semiconductor layer 210 (such as SiGe in an embodiment) and with no (or minimal) etching to the semiconductor layer 215 (such as Si in an embodiment), the semiconductor layer 239 (such as Si in an embodiment), and the isolation features 230. As a result, the portion 215' of the semiconductor layer 215, the semiconductor layer 239, and the isolation features 230 are exposed in the trenches 272. The etching process can be dry etching, wet etching, reactive ion etching, or other etching methods. Particularly, in the present embodiment, the etching of the semiconductor layer 210 is self-aligned. In other words, the operation 128 does not need to make an etch mask (e.g., an etch mask formed by photolithography processes) in order to etch the semiconductor layer 210. Rather, it relies on the etch selectivity of the materials in the semiconductor layer 210 and its surrounding layers.

At operation 130, the method 100 (FIG. 1C) forms one or more dielectric layers 276 to fill the trenches 272. The resultant structure is shown in FIGS. 17A-17E according to an embodiment. FIG. 17A illustrates a top view of the device 200, and FIGS. 17B, 17C, 17D, and 17E illustrate cross-sectional views of the device 200, in portion, along the B-B line, the C-C line, the D-D line, and the E-E line in FIG. 17A, respectively. In various embodiments, the one or more dielectric layers 276 may include silicon nitride ($Si_3N_4$), silicon oxide ($SiO_2$), tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer(s) 276 may be formed by ALD, CVD, PECVD (plasma enhanced CVD), FCVD (flowable CVD), or other suitable methods. The operation 130 may further perform a CMP process to the dielectric layer(s) 276, which planarizes the backside of the device 200 and exposes the semiconductor layer 239 for further processing.

At operation 132, the method 100 (FIG. 1C) removes the semiconductor layer 239 from the backside of the device 200. The resultant structure is shown in FIGS. 18A-18E according to an embodiment. FIG. 18A illustrates a top view of the device 200, and FIGS. 18B, 18C, 18D, and 18E illustrate cross-sectional views of the device 200, in portion, along the B-B line, the C-C line, the D-D line, and the E-E line in FIG. 18A, respectively. In the present embodiment, the operation 132 applies an etching process that is tuned to be selective to the materials of the semiconductor layer 239 (such as Si in an embodiment) and with no (or minimal) etching to the dielectric layer(s) 276, the isolation features 230, and the dielectric layer 232. The etching process may partially etch the source feature 260. Also, the etching process is substantially vertical such that it has no (or minimal) etching to the semiconductor layer 215. The etching process results in a trench 278 that exposes the source feature 260 from the backside of the device 200. The etching process can be dry etching, wet etching, reactive ion etching, or other etching methods. Particularly, in the present embodiment, the etching of the semiconductor layer 239 is self-aligned. In other words, the operation 132 does not need to make an etch mask (e.g., an etch mask formed by photolithography processes) in order to etch the semiconductor layer 239. Rather, it relies on the etch selectivity of the materials in the semiconductor layer 239 and its surrounding layers, particularly the dielectric layer(s) 276. This beneficially forms the trenches 278 to be aligned with the underlying source feature 260 without misalignments such as those introduced by photolithography overlay shift. Using this process will result in a backside source contact (or source via) that is ideally aligned with the source feature 260, as will be discussed below.

Figure 19A:
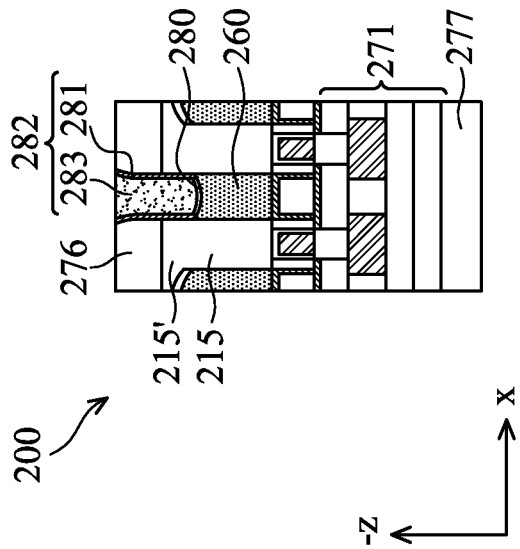
Figure 19C:
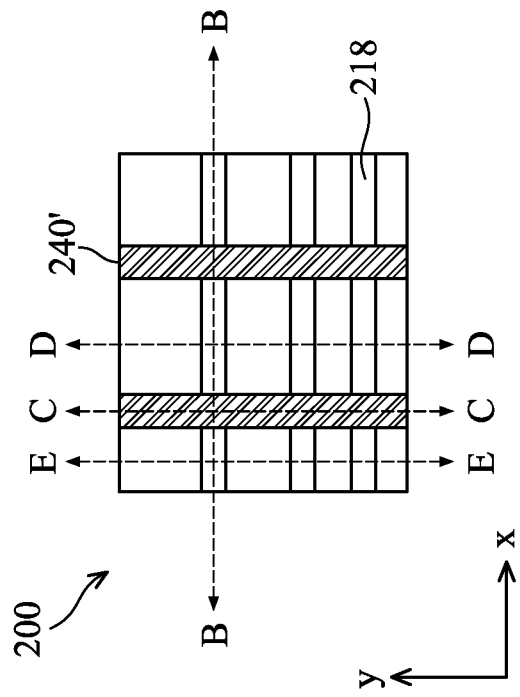
Figure 19B:
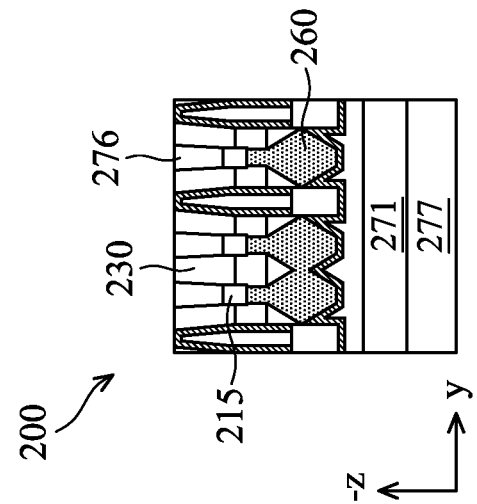
Figure 19D:
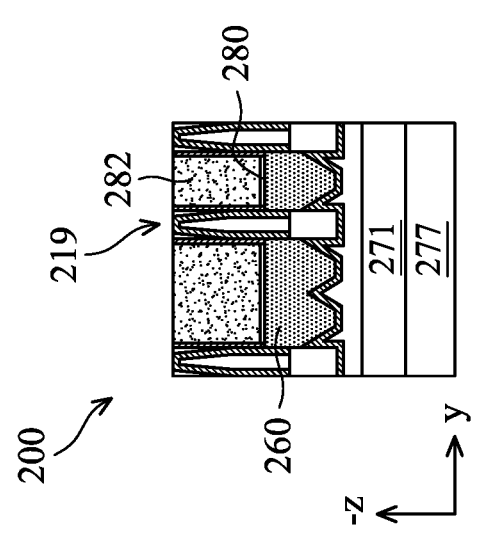

At operation 134, the method 100 (FIG. 1C) forms a backside source silicide feature 280 and a backside source contact 282. The resultant structure is shown in FIGS. 19A-19E according to an embodiment. FIG. 19A illustrates a top view of the device 200, and FIGS. 19B, 19C, 19D, and 19E illustrate cross-sectional views of the device 200, in portion, along the B-B line, the C-C line, the D-D line, and the E-E line in FIG. 19A, respectively. As illustrated in FIGS. 19B and 19D, the backside source contact 282 is self-aligned to the source feature 260 as a result of the self-aligned etching processes discussed above with reference to FIGS. 18B and 18D. Therefore, it is isolated from the nearby gate stacks 240' by the dielectric layers 276. The self-aligned backside contact 282 minimizes the risks of short circuit between the source feature 260 and the nearby gate stacks 240'.

Figure 19E:
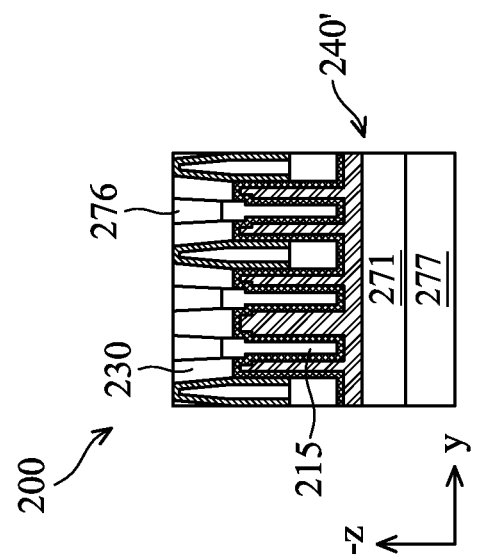

In some embodiments, the operation 134 includes depositing one or more metals into the holes 278, performing an annealing process to the device 200 to cause reaction between the one or more metals and the source feature 260 to produce the silicide feature 280, and removing un-reacted portions of the one or more metals, leaving the silicide features 280 in the holes 278. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In the depicted embodiment, the source contact 282 includes a conductive barrier layer 281 and a metal fill layer 283 over the conductive barrier layer 281. The conductive barrier layer 281 functions to prevent metal materials of the metal fill layer 283 from diffusing into the layers adjacent the source contacts 282, such as the layers 215, 230, and 276. The conductive barrier layer 281 may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer 283 may include tungsten (W), cobalt (Co), molybdenum (Mo), ruthenium (Ru), copper (Cu), aluminum (Al), titanium (Ti), tantalum (Ta), or other metals, and may be formed by CVD, PVD, ALD, plating, or other suitable processes. In some embodiments, the conductive barrier layer 281 is omitted in the source contact 282. The operation 134 may perform a CMP process to remove excessive materials of the source contact 282. As shown in FIGS. 19C and 19E, the gate stacks 240' and the drain features 260 are protected from the various deposition and etching processes in the operation 134 by the isolation features 230 and 276.

Figure 20B:
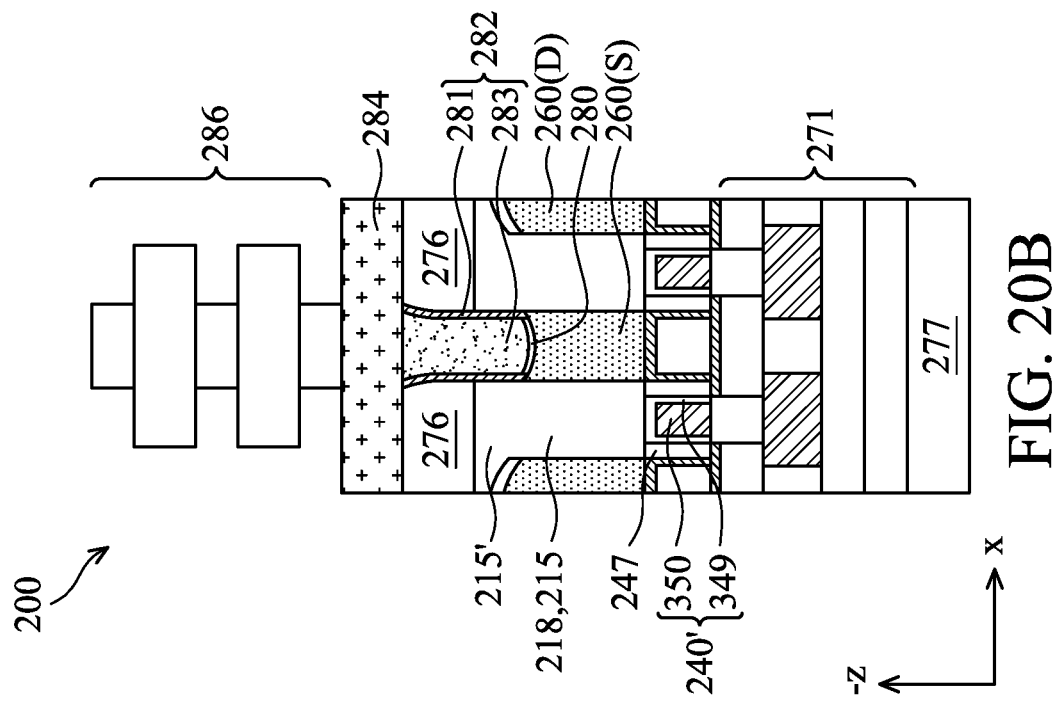
Figure 20A:
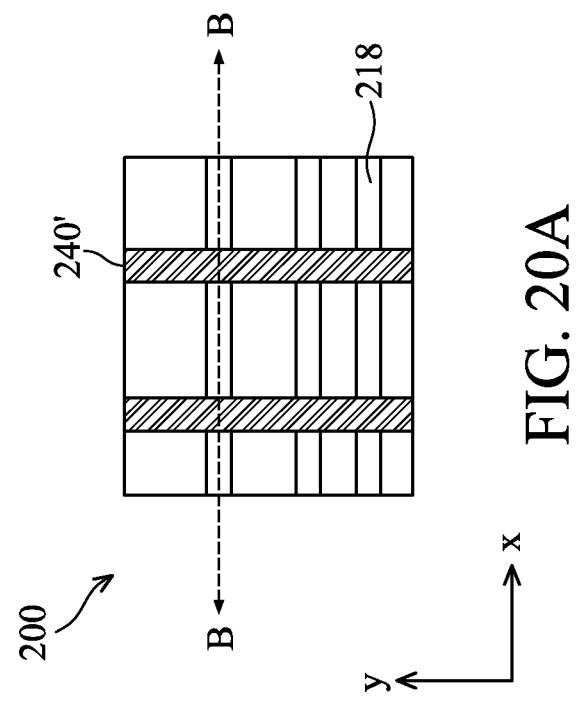

At operation 136, the method 100 (FIG. 1C) forms backside power rails 284 and a backside interconnect 286. The resultant structure is shown in FIGS. 20A-20B according to an embodiment. FIG. 20A illustrates a top view of the device 200, and FIG. 20B illustrates a cross-sectional view of the device 200, in portion, along the B-B line in FIG. 20A. As illustrated in FIG. 20B, the backside power rails 284 are electrically connected to the backside source contact 282 and are isolated from the drain features 260 and the channel portion of the semiconductor layer 215 by the dielectric layer(s) 276 and the semiconductor layer 215'. As shown in FIG. 20B, the source feature 260 is disposed between two segments of a semiconductor fin 218 (or considered as two semiconductor fins aligned along the "x" direction) and directly interfaces with the semiconductor layer 215 in the semiconductor fin 218. A first portion of the dielectric layer(s) 276 is disposed between the power rail 284 and the first segment of the semiconductor fin, and a second portion of the dielectric layer(s) 276 is disposed between the power rail 284 and the second segment of the semiconductor fin. A top portion of the self-aligned contact 282 is sandwiched between the first and the second portions of the dielectric layer(s) 276, and a lower portion of the self-aligned contact 282 is sandwiched between the first and the second segments of the semiconductor fin. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), aluminum (Al), titanium (Ti), tantalum (Ta), or other metals, and may be deposited by CVD, PVD, ALD, plating, or other suitable processes. Although not shown in FIG. 20B, the backside power rails 284 are embedded in one or more dielectric layers, and the backside interconnect 286 includes wires and vias embedded in one or more dielectric layers. In some embodiment, the backside power rails 284 are considered part of the backside interconnect 286. Having backside power rails 284 beneficially increases the number of metal tracks available in the device 200 for directly connecting to source/drain contacts and vias. It also increases the gate density for greater device integration than other structures without the backside power rails 284. The backside power rails 284 may have wider dimension than the first level metal (M0) tracks on the frontside of the device 200, which beneficially reduces the backside power rail resistance.

At operation 138, the method 100 (FIG. 1C) performs further fabrication processes to the device 200. For example, it may form passivation layers on the backside of the device 200, remove the carrier 277, and perform other BEOL processes.

In the above embodiments, the source feature 260 is formed with a backside silicide feature and a backside self-aligned contact, while the drain feature 260 is isolated from backside power rails. Each of the source and drain features 260 may be formed with a frontside silicide features and a frontside contact. In an alternative embodiment, the drain feature 260 may be formed with a backside silicide feature and a backside self-aligned contact, while the source feature 260 is isolated from backside power rails. This may be achieved by switching the processes that are specifically applied to the source region with those that are specifically applied to the drain region in the above embodiment. For example, the semiconductor layer 239 may be provided in the drain region, but not in the source region. In another alternative embodiment, both the source feature 260 and the drain feature 260 may be formed with backside silicide features and backside self-aligned contacts. This may be achieved by applying the processes that are specifically applied to the source region in the above embodiment to both the source region and the drain region. For example, the semiconductor layer 239 may be provided in both the source region and the drain region.

Although not intended to be limiting, embodiments of the present disclosure provide one or more of the following advantages. For example, embodiments of the present disclosure form backside silicide features and backside self-aligned contacts to source/drain features, which advantageously reduces source/drain resistance and minimizes the risks of the shorting the source/drain features to nearby conductors including the gate stacks. Embodiments of the present disclosure can be readily integrated into existing semiconductor manufacturing processes.

In one example aspect, the present disclosure is directed to a semiconductor structure that includes a power rail on a back side of the semiconductor structure; a first interconnect structure on a front side of the semiconductor structure; and a source feature, a drain feature, a first semiconductor fin, and a gate structure that are between the power rail and the first interconnect structure, wherein the first semiconductor fin connects the source feature and the drain feature, and the gate structure is disposed on a front surface and two side surfaces of the first semiconductor fin. The semiconductor structure further includes an isolation structure disposed between the power rail and the drain feature and between the power rail and the first semiconductor fin and a via penetrating through the isolation structure and connecting the source feature to the power rail.

In some embodiments, the semiconductor structure further includes a silicon layer between the drain feature and the isolation structure. In some embodiments, the semiconductor structure further includes a second semiconductor fin that is aligned with the first semiconductor fin along a lengthwise direction of the first semiconductor fin, wherein the source feature directly interfaces with the first and the second semiconductor fins, a first portion of the isolation structure is disposed between the power rail and the first semiconductor fin, a second portion of the isolation structure is disposed between the power rail and the second semiconductor fin, a first portion of the via is sandwiched between the first and the second portions of the isolation structure, and a second portion of the via is sandwiched between the first and the second semiconductor fins.

In an embodiment, the semiconductor structure further includes a silicide feature between the source feature and the via. In some embodiments, the semiconductor structure further includes a dielectric barrier layer between the first semiconductor fin and the via.

In an embodiment of the semiconductor structure, the via includes one of Cu, Al, Co, W, Ti, Ta, Mo, and Ru. In an embodiment, the semiconductor structure further includes a second interconnect structure on the back side of the semiconductor structure and over the power rail.

In another embodiment, the semiconductor structure further includes a first dielectric fin and a second dielectric fin that are lengthwise parallel to the first semiconductor fin and extend from the back side of the semiconductor structure towards the front side of the semiconductor structure, wherein the first semiconductor fin is disposed between the first and the second dielectric fins. In a further embodiment, the via fills a gap that extends from the first dielectric fin to the second dielectric fin along a direction perpendicular to a lengthwise direction of the first semiconductor fin.

In another example aspect, the present disclosure is directed to a method that includes providing a structure having an insulator, a first semiconductor layer over the insulator, a second semiconductor layer over the first semiconductor layer, and a third semiconductor layer over the second semiconductor layer, wherein the first and the third semiconductor layer include a first semiconductor material, the second semiconductor layer includes a second semiconductor material that is different from the first semiconductor material. The method further includes patterning the structure to form fins, each of the fins including a portion of the third semiconductor layer over a portion of the second semiconductor layer over a portion of the first semiconductor layer; forming a sacrificial gate structure engaging a channel region of a first fin of the fins and gate spacers on opposing sidewalls of the sacrificial gate structure; etching a source trench and a drain trench into the first fin adjacent the gate spacers, wherein the source and the drain trenches do not reach the second semiconductor layer; forming an etch mask that covers the drain trench and exposes the source trench; etching the first fin through the etch mask, thereby extending the source trench through the second semiconductor layer and into the first semiconductor layer; and epitaxially growing a fourth semiconductor layer in the source trench and partially filling the source trench, wherein the fourth semiconductor layer extends from the first semiconductor layer to the third semiconductor layer, wherein the fourth semiconductor layer comprises the first semiconductor material.

In some embodiments of the method, the first semiconductor material is silicon, and the second semiconductor material is silicon germanium. In a further embodiment, the fourth semiconductor layer comprises undoped silicon.

In some embodiments, after the epitaxially growing the fourth semiconductor layer, the method further includes removing the etch mask and epitaxially growing a source feature in the source trench and a drain feature in the drain trench. In some further embodiments, the method further includes bonding a front side of the structure to a carrier wafer, wherein the insulator is on a back side of the structure; thinning the structure from the back side of the structure until the second semiconductor layer is exposed; and replacing the second semiconductor layer with a dielectric layer. In some embodiments, the method further includes removing the fourth semiconductor layer, thereby forming a hole exposing the source feature from the back side of the structure and forming a via in the hole. In some embodiments, the method further includes forming a power rail on the back side of the structure, directly on the dielectric layer, and connecting to the via.

In yet another example aspect, the present disclosure is directed to a method that includes providing a structure having an insulator, multiple fins on the insulator, a sacrificial gate structure engaging a channel region of a first fin of the fins, and gate spacers on opposing sidewalls of the sacrificial gate structure, wherein the first fin includes a first silicon layer over the insulator, a silicon germanium layer over the first silicon layer, and a second silicon layer over the silicon germanium layer. The method further includes etching a source trench and a drain trench into the first fin adjacent the gate spacers, wherein the drain trench does not expose the silicon germanium layer, and wherein the source trench extends through the second silicon layer and the silicon germanium layer and into the first silicon layer. The method further includes epitaxially growing a third silicon layer in the source trench and partially filling the source trench, wherein the third silicon layer extends from the first silicon layer to the second silicon layer. The method further includes epitaxially growing a source feature from the second and the third silicon layers in the source trench and a drain feature from the second silicon layer in the drain trench.

In some embodiments, the method further includes replacing the sacrificial gate structure with a high-k metal gate. In a further embodiment, the method includes bonding a front side of the structure to a carrier wafer, wherein the insulator is on a back side of the structure; thinning the structure from the back side of the structure until the silicon germanium layer is exposed; and replacing the silicon germanium layer with a dielectric layer. In a further embodiment, the method includes removing the third silicon layer, thereby forming a hole through the dielectric layer and exposing the source feature from the back side of the structure; forming a via in the hole; and forming a power rail on the back side of the structure and connecting to the via.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a power rail on a back side of the semiconductor structure;
a first interconnect structure on a front side of the semiconductor structure;
a source feature, a drain feature, a first semiconductor fin, and a gate structure that are between the power rail and the first interconnect structure, wherein the first semiconductor fin connects the source feature and the drain feature, and the gate structure is disposed on a front surface and two side surfaces of the first semiconductor fin;
an isolation structure disposed between the power rail and the drain feature and between the power rail and the first semiconductor fin;
a via penetrating through the isolation structure and connecting the source feature to the power rail; and
a first dielectric fin and a second dielectric fin that are lengthwise parallel to the first semiconductor fin and extend from the back side of the semiconductor structure towards the front side of the semiconductor structure, wherein the first semiconductor fin is disposed between the first and the second dielectric fins.

2. The semiconductor structure of claim 1, further comprising:
a silicon layer between the drain feature and the isolation structure.

3. The semiconductor structure of claim 1, further comprising a second semiconductor fin that is aligned with the first semiconductor fin along a lengthwise direction of the first semiconductor fin, wherein the source feature directly interfaces with the first and the second semiconductor fins, a first portion of the isolation structure is disposed between the power rail and the first semiconductor fin, a second portion of the isolation structure is disposed between the power rail and the second semiconductor fin, a first portion of the via is sandwiched between the first and the second portions of the isolation structure, and a second portion of the via is sandwiched between the first and the second semiconductor fins.

4. The semiconductor structure of claim 1, further comprising a silicide feature between the source feature and the via.

5. The semiconductor structure of claim 1, further comprising a dielectric barrier layer between the first semiconductor fin and the via.

6. The semiconductor structure of claim 1, wherein the via includes one of Cu, Al, Co, W, Ti, Ta, Mo, and Ru.

7. The semiconductor structure of claim 1, further comprising a second interconnect structure on the back side of the semiconductor structure and over the power rail.

8. The semiconductor structure of claim 1, wherein the via fills a gap that extends from the first dielectric fin to the second dielectric fin along a direction perpendicular to a lengthwise direction of the first semiconductor fin.

9. A semiconductor structure, comprising:
a power rail on a back side of the semiconductor structure;
a source feature, a drain feature, a first semiconductor fin, and a gate structure on a front side of the semiconductor structure, wherein the source feature and the drain feature sandwich the first semiconductor fin, and the gate structure engages a channel region of the first semiconductor fin;
an isolation structure disposed between the power rail and the first semiconductor fin;
a via connecting one of the source and the drain features to the power rail; and
a first dielectric fin and a second dielectric fin that are lengthwise parallel to the first semiconductor fin and sandwich the first semiconductor fin, wherein the via extends from the first dielectric fin to the second dielectric fin along a direction perpendicular to a lengthwise direction of the first semiconductor fin.

10. The semiconductor structure of claim 9, wherein a topmost surface of the via is higher than a bottommost surface of another one of the source and the drain features.

11. The semiconductor structure of claim 9, further comprising:
a silicon layer vertically between the isolation structure and another one of the source and the drain features.

12. The semiconductor structure of claim 11, wherein the silicon layer has a thickness in a range of about 5 nm to about 15 nm.

13. The semiconductor structure of claim 9, wherein a side surface of the via curves inwardly.

14. The semiconductor structure of claim 13, further comprising:
a dielectric barrier layer on the side surface of the via.

15. The semiconductor structure of claim 9, wherein the via fills a gap that extends from the first dielectric fin to the second dielectric fin along a direction perpendicular to a lengthwise direction of the first semiconductor fin.

16. A semiconductor structure, comprising:
a power rail on a back side of the semiconductor structure;

a source feature, a drain feature, a first semiconductor fin, and a gate structure on a front side of the semiconductor structure, wherein the first semiconductor fin connects the source feature and the drain feature, and the gate structure engages a channel region of the first semiconductor fin;

an isolation structure disposed between the power rail and the drain feature and between the power rail and the first semiconductor fin;

a via disposed between the source feature and the power rail and electrically connecting the source feature to the power rail; and a dielectric barrier layer between the first semiconductor fin and the via and between the isolation structure and the via; and a first dielectric fin and a second dielectric fin that are lengthwise parallel to the first semiconductor fin and sandwich the first semiconductor fin, wherein the via extends from the first dielectric fin to the second dielectric fin along a direction perpendicular to a lengthwise direction of the first semiconductor fin.

17. The semiconductor structure of claim 16, wherein a top surface of the via forms an arc extending towards the front side of the semiconductor structure, and a side surface of the via curves inwardly.

18. The semiconductor structure of claim 16, further comprising:
a silicon layer vertically between the isolation structure and the drain feature, wherein the silicon layer has a thickness in a range of about 5 nm to about 15 nm.

19. The semiconductor structure of claim 16, further comprising:
an interconnect structure on the front side of the semiconductor structure.

20. The semiconductor structure of claim 16, wherein the via fills a gap that extends from the first dielectric fin to the second dielectric fin along a direction perpendicular to a lengthwise direction of the first semiconductor fin.

* * * * *